(12) United States Patent
Nakanishi et al.

(10) Patent No.: US 8,035,460 B2
(45) Date of Patent: Oct. 11, 2011

(54) SURFACE ACOUSTIC WAVE DEVICE, SURFACE ACOUSTIC WAVE FILTER AND ANTENNA DUPLEXER USING THE SAME, AND ELECTRONIC EQUIPMENT USING THE SAME

(75) Inventors: Hidekazu Nakanishi, Osaka (JP); Ryoichi Takayama, Osaka (JP); Yukio Iwasaki, Osaka (JP); Yosuke Hamaoka, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 442 days.

(21) Appl. No.: 12/279,631

(22) PCT Filed: Feb. 14, 2007

(86) PCT No.: PCT/JP2007/052631
§ 371 (c)(1),
(2), (4) Date: Aug. 15, 2008

(87) PCT Pub. No.: WO2007/094368
PCT Pub. Date: Aug. 23, 2007

(65) Prior Publication Data
US 2010/0164646 A1 Jul. 1, 2010

(30) Foreign Application Priority Data

Feb. 16, 2006 (JP) .................................. 2006-039001
Sep. 21, 2006 (JP) .................................. 2006-255588

(51) Int. Cl.
*H03H 9/64* (2006.01)
*H03H 9/72* (2006.01)
*H03H 3/08* (2006.01)

(52) U.S. Cl. ...... 333/133; 333/193; 333/195; 310/313 B; 310/313 A; 29/25.35; 204/192.1; 427/100

(58) Field of Classification Search .......... 333/193–196, 333/133; 310/313 A, 313 B, 313 D; 29/25.35, 29/594; 204/192.1, 192.11, 192.12; 427/100
See application file for complete search history.

(56) References Cited

U.S. PATENT DOCUMENTS 5,506,552 A 4/1996 Seki et al.
5,729,186 A 3/1998 Seki et al.
(Continued)

FOREIGN PATENT DOCUMENTS
EP 1 971 026 A1 9/2008
(Continued)

OTHER PUBLICATIONS

English language machine translation of JP 2005-348139 published Dec. 15, 2005.*

(Continued)

*Primary Examiner* — Barbara Summons
(74) *Attorney, Agent, or Firm* — Pearne & Gordon LLP

(57) ABSTRACT

A surface acoustic wave device includes a substrate including lithium niobate; a IDT being provided on an upper surface of the substrate and including a plurality of electrode fingers; and a protective film covering the IDT and having an uneven shape on an upper surface thereof. When a pitch width of one pitch of the IDT is p, a width of one of the electrode fingers is p1, a width between the electrode fingers is p2, and a thickness of the IDT is h, following relations are satisfied, $p1+p2=p$, and $h/(2 \times p) \geq 4.5\%$. With this configuration, an appropriate reflection characteristic is realized, and the surface acoustic wave device having excellent temperature coefficient of frequency and electrical characteristic can be obtained.

21 Claims, 17 Drawing Sheets

U.S. PATENT DOCUMENTS

| | | | |
|---|---|---|---|
| 5,998,907 | A | 12/1999 | Taguchi et al. |
| 6,037,847 | A | 3/2000 | Ueda et al. |
| 6,791,237 | B2 | 9/2004 | Yamanouchi |
| 6,975,185 | B2 | 12/2005 | Tsutsumi et al. |
| 7,209,018 | B2 | 4/2007 | Nakao et al. |
| 7,423,365 | B2 | 9/2008 | Tsutsumi et al. |
| 7,538,636 | B2 | 5/2009 | Takayama et al. |
| 2002/0140316 | A1 | 10/2002 | Yamanouchi |
| 2003/0080831 | A1 | 5/2003 | Naumenko et al. |
| 2003/0151329 | A1* | 8/2003 | Kadota et al. ............. 310/313 A |
| 2004/0174233 | A1 | 9/2004 | Takayama et al. |
| 2006/0022768 | A1 | 2/2006 | Yokota et al. |
| 2006/0158800 | A1 | 7/2006 | Takayama et al. |
| 2007/0096592 | A1* | 5/2007 | Kadota et al. ............. 310/313 A |

FOREIGN PATENT DOCUMENTS

| | | | |
|---|---|---|---|
| JP | 63260213 A | | 10/1988 |
| JP | 05-267990 | | 10/1993 |
| JP | 07-074586 | | 3/1995 |
| JP | 10-84245 A | | 3/1998 |
| JP | 11-055070 | | 2/1999 |
| JP | 11-88100 A | | 3/1999 |
| JP | 2002314365 A | | 10/2002 |
| JP | 2003-209458 | | 7/2003 |
| JP | 2004-120685 | | 4/2004 |
| JP | 2004-222267 | | 8/2004 |
| JP | 2004-254291 | | 9/2004 |
| JP | 2005-080202 | | 3/2005 |
| JP | 2005-348139 | * | 12/2005 |
| JP | 2005347892 A | | 12/2005 |
| KR | 2002-71736 A | | 9/2002 |
| KR | 2005-85878 A | | 8/2005 |
| KR | 2008-0077193 | | 8/2008 |
| WO | 2004-066493 | | 8/2004 |
| WO | WO 2005/034347 | * | 4/2005 |
| WO | 2006/003933 A1 | | 1/2006 |
| WO | 2006/032335 A1 | | 3/2006 |

OTHER PUBLICATIONS

Japanese Office action for Appl. No. JP 2006-039001 dated Mar. 23, 2010.

Japanese Office action for Appl. No. JP 2006-255588 dated Mar. 23, 2010.

International Search Report for PCT/JP2007/052631; Mar. 27, 2007.

European Search Report dated Aug. 26, 2009.

Wright; "A Review fo Saw Resonator Filter Technology", Ultrasonics Symposium-29, 1992, pp. 29-38.

European Office action for 07 714 184.4-2215 dated Apr. 29, 2011.

* cited by examiner

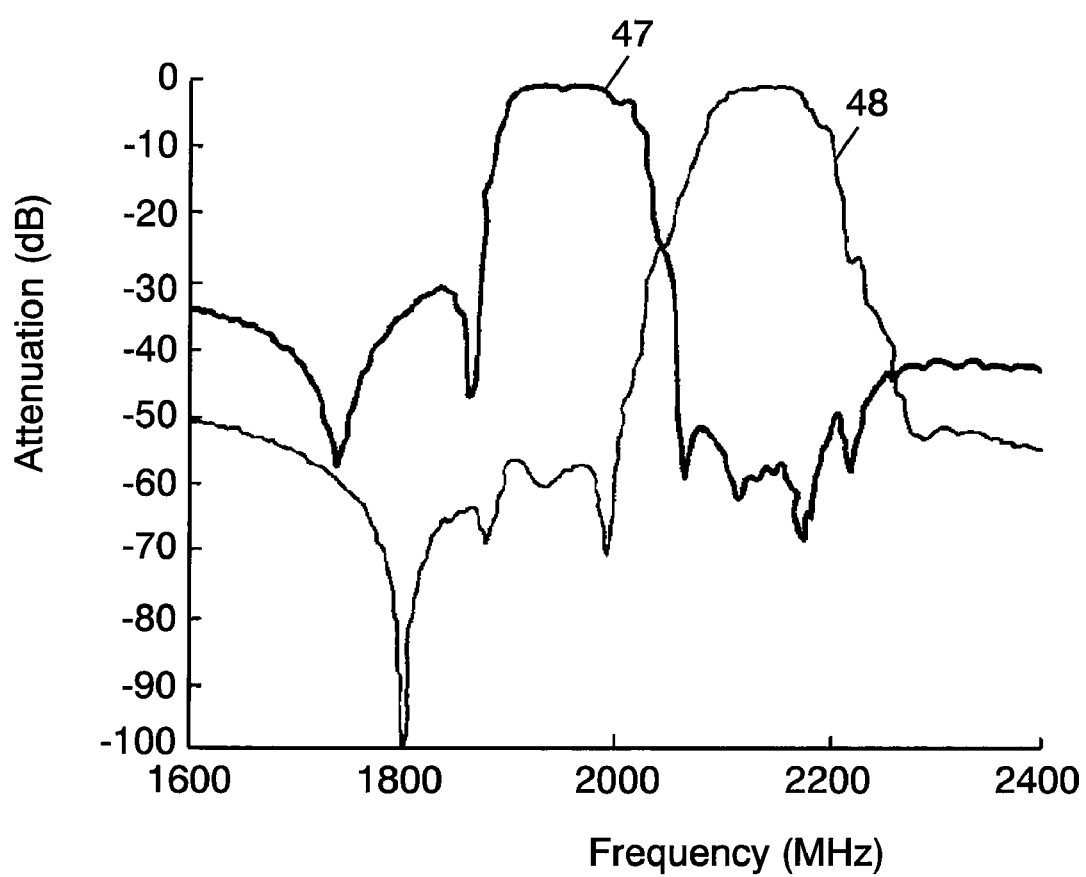

SURFACE ACOUSTIC WAVE DEVICE, SURFACE ACOUSTIC WAVE FILTER AND ANTENNA DUPLEXER USING THE SAME, AND ELECTRONIC EQUIPMENT USING THE SAME

This application is a U.S. national phase application of PCT international application PCT/JP2007/052631, filed Feb. 14, 2007.

TECHNICAL FIELD

The present invention relates to a surface acoustic wave device used as a resonator or a band-pass filter, and a surface acoustic wave filter and an antenna duplexer using the same, as well as electronic equipment using the same.

BACKGROUND ART

As to a conventional technology, a surface acoustic wave device (hereinafter, referred to as a "SAW device") is described hereinafter as an example.

Recently, a large number of small and light SAW devices have been used in electronic equipment such as various types of mobile communication terminal devices. In particular, in a radio circuit part of a mobile phone system within a band of 800 MHz to 2 GHz, a surface acoustic wave filter formed by using a lithium tantalate (hereinafter, referred to as "LT") substrate has been widely used. However, an LT substrate has a large thermal expansion coefficient of a substrate in the direction in which a surface acoustic wave propagates. Furthermore, the elastic constant itself varies according to temperatures. Therefore, there is a problem in terms of the temperature characteristics that the frequency characteristic of a filter is also greatly shifted according to the change in temperatures.

In such circumstances, for example, Japanese Patent Unexamined Publication No. 2004-254291 (patent document 1) discloses a method of obtaining a SAW device in which the temperature characteristics is improved. The SAW device described in patent document 1 includes a piezoelectric substrate, an electrode film and an insulating film. The electrode film is formed on the piezoelectric substrate and constitutes at least one IDT. The insulating film is formed by sputtering on the piezoelectric substrate so as to cover the electrode film. In addition, the insulating film has unevenness on the upper surface thereof. Furthermore, when the film thickness of the electrode film is in the range from 1-3% of the wavelength of the surface wave to be excited, excellent electrical characteristics can be obtained.

[Patent Document 1] Japanese Patent Unexamined Publication No. 2004-254291

SUMMARY OF THE INVENTION

The present invention obtains an electronic component having excellent temperature characteristics and electrical characteristics.

A surface acoustic wave device of the present invention includes a substrate including lithium niobate, a IDT, and a protective film. The IDT is provided on an upper surface of the substrate and includes a plurality of electrode fingers. The protective film covers the IDT and has an uneven shape on an upper surface thereof. When a pitch width of one pitch of the IDT is p, a width of one of the electrode fingers that form the IDT is p1, a width between the electrode fingers is p2, and a thickness of the IDT is h, following relations are satisfied, $p1+p2=p$, and $h/(2\times p) \geqq 4.5\%$. With this configuration, an appropriate reflection characteristic is realized, and a surface acoustic wave device having excellent temperature characteristics and electrical characteristics can be obtained.

BRIEF DESCRIPTION OF THE DRAWINGS

FIG. 27 is an electrical characteristic graph showing an electrical characteristic of the electronic component in accordance with the sixth exemplary embodiment of the present invention.

Figure 1:
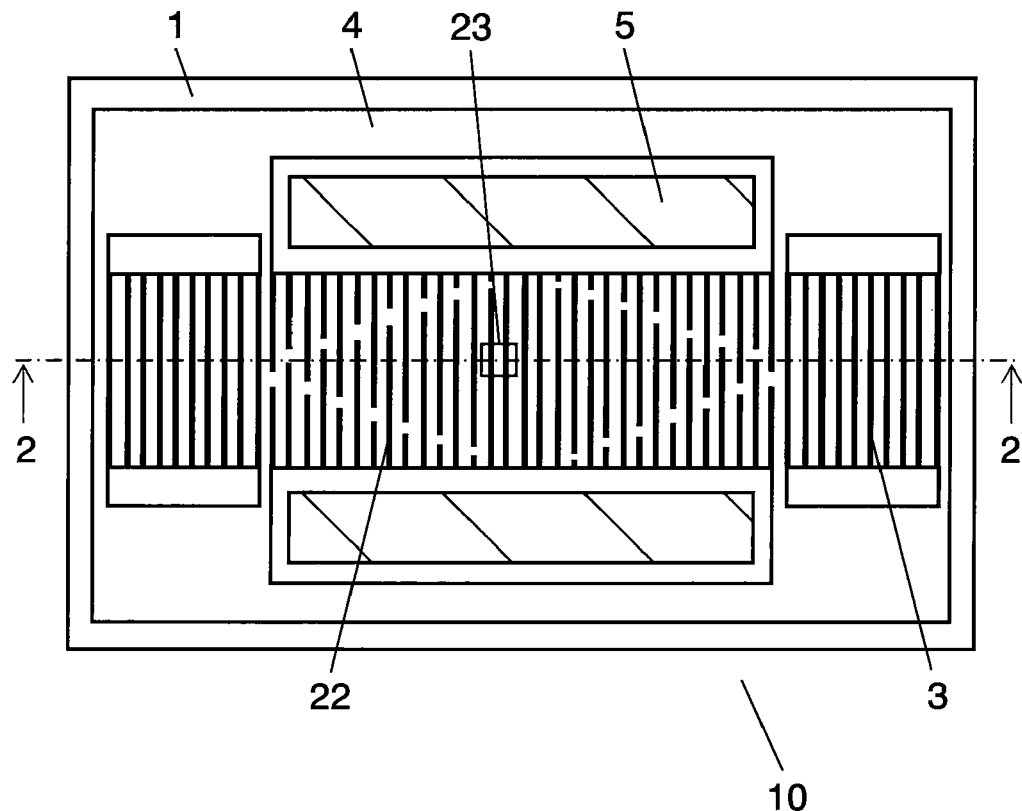
FIG. 1 is a top view showing a configuration of an electronic component in accordance with a first exemplary embodiment of the present invention.

REFERENCE MARKS IN THE DRAWINGS 1 substrate
3 reflector electrode
4, 34 protective film
4a convex portion
4b concave portion
5 pad
10, 10a, 83, 84 surface acoustic wave device
22 IDT
22a electrode finger
31 LN substrate
32 electrode film
33 first resist film
35 second resist film
80 surface acoustic wave filter
81 substrate
82 protective film
85 input terminal
86 output terminal
87 ground terminal
88 line
89 branch point
90 longitudinal mode binding type surface acoustic wave filter
151 antenna
152 antenna duplexer
153 transmitting SAW filter
154 receiving SAW filter
155 phase circuit

DETAILED DESCRIPTION OF THE PREFERRED EMBODIMENTS

Hereinafter, an electronic component of exemplary embodiments of the present invention is described with reference to the drawings.

In the exemplary embodiments, a surface acoustic wave device (hereinafter, referred to as a "SAW device") is described as an example of an electronic component. Note here that a SAW device has a function as a resonator.

First Exemplary Embodiment

Figure 2:
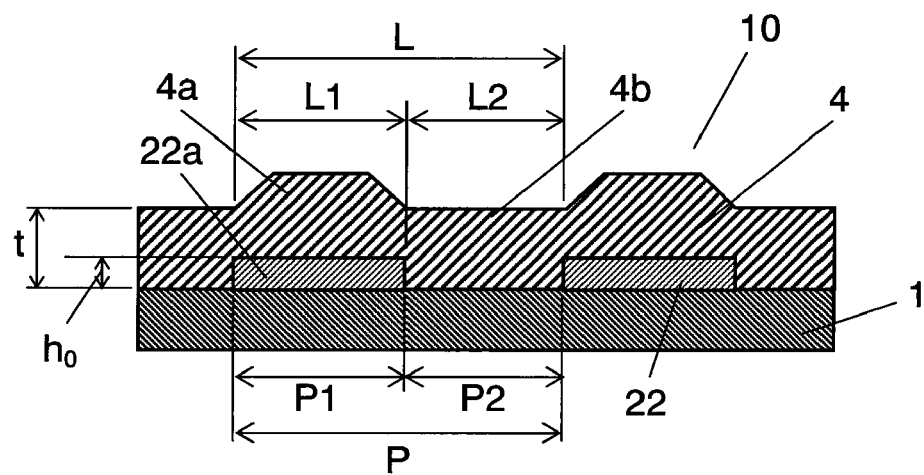
FIG. 2 is a partial sectional view showing the electronic component taken along line 2-2 of FIG. 1.

FIG. 1 is a top view showing a SAW device as an electronic component in accordance with a first exemplary embodiment of the present invention. FIG. 2 is a sectional view showing part 23 of the SAW device taken along line 2-2 of FIG. 1.

As shown in FIGS. 1 and 2, surface acoustic wave device 10 (hereinafter, referred to as "SAW device 10") in accordance with the first exemplary embodiment includes substrate 1, IDT 22, reflector electrode 3, and protective film 4. IDT 22 is weighted by apodization on an upper surface of substrate 1, and is provided with predetermined frequency characteristics. Reflector electrodes 3 are provided on both sides of IDT 22. Protective film 4 covers at least IDT 22 and reflector electrode 3. Furthermore, IDT 22 has pad 5 that is electrically connected to IDT 22. IDT 22 takes out an electric signal via pad 5. Thus, SAW device 10 is configured.

Substrate 1 is made of lithium niobate ($LiNbO_3$, hereinafter, referred to as "LN"). A substrate made of lithium niobate is generally called an LN substrate. Furthermore, substrate 1 includes lithium niobate cut out from a Y-plate rotated by D degree around the X-axis in the Z-axis direction. Note here that a 5° Y-LN substrate, in which rotation angle D of the rotation around the X axis in the Z axis direction is 5 degree, is used.

A pair of IDT 22 and a pair of reflector electrodes 3 are formed on the upper surface of substrate 1, respectively, and are made of aluminum (hereinafter, referred to as "Al") or an Al alloy including Al as a main component. IDT 22 includes electrode fingers 22a facing each other with a gap provided between neighboring electrode fingers 22a.

Preferably, protective film 4 is made of silicon oxide such as silicon dioxide (hereinafter, referred to as $SiO_2$). As shown in FIGS. 1 and 2, protective film 4 has an uneven shape on an upper surface thereof. Convex portion 4a of protective film 4 is provided above a portion having IDT 22 and reflector electrode 3 on the upper surface of substrate 1. Concave portion 4b of protective film 4 is provided in a portion between convex portions 4a, in which IDT 22 and reflector electrode 3 are not present on the upper surface of substrate 1 and their vicinities.

Hereafter, one convex portion 4a and one concave portion 4b of protective film 4 is defined as one pitch, respectively, the pitch width of this one pitch is L, the width of convex portion 4a of protective film 4 is L1, and the width of concave portion 4b of protective film 4 is L2. That is to say, the relation: L=L1+L2 is satisfied.

Furthermore, similar to the one pitch of protective film 4, a distance between one electrode finger 22a of one IDT 22 and a portion in which another electrode finger 22a that is adjacent to the one electrode finer 22a at one end is located is defined as one pitch width p of IDT 22. In addition, the width of one electrode finger 22a is p1, and the width of a gap between the neighboring electrode fingers is p2. That is to say, p=p1+p2 is satisfied. Note here that pitch width L of one pitch of protective film 4 and pitch width p of IDT 22 satisfy the relation: L≈p. Furthermore, the wavelength of an operation center frequency of the surface acoustic wave in SAW device 10 is λ=2×p.

The height from the surface of substrate 1 that is in contact with protective film 4 to concave portion 4b of protective film 4 is defined as t. Thickness h of IDT 22 is defined as equivalent film thickness h of aluminum, which is converted from height $h_0$ from the surface of substrate 1 to an upper surface of IDT 22. That is to say, when the material of IDT 22 is Al, the height from the surface of substrate 1 to the upper surface of IDT 22 is defined as a thickness of IDT 22. That is to say, $h_0$=h is satisfied. However, when the material of IDT 22 is a material other than Al, the equivalent film thickness h of aluminum is defined as $h=h_0 \times (\rho_M/\rho_{Al})$ by calculating from height $h_0$ from the surface of substrate 1 to the upper surface of IDT 22 by using density $\rho_{Al}$ of Al and density $\rho_M$ of the material used for IDT 22. Note here that FIG. 2 shows only two electrode fingers 22a.

Hereinafter, a method of manufacturing SAW device 10 configured as mentioned above is described with reference to drawings.

Figure 3A:
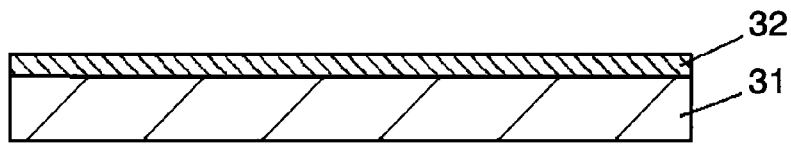
FIG. 3A is a schematic sectional view to illustrate a method of manufacturing the electronic component of FIG. 1.

FIGS. 3A to 3H are schematic sectional views to illustrate a method of manufacturing SAW device 10 in accordance with the first exemplary embodiment of the present invention. Firstly, as shown in FIG. 3A, a film of Al or an Al alloy is formed on an upper surface of LN substrate 31 by a method such as vapor deposition and sputtering. Thus, electrode film 32 is formed. Note here that electrode film 32 is formed into electrode finger 22a of IDT 22 or reflector electrode 3 or pad 5 by way of following manufacturing steps. LN substrate 31 is shown only partially. However, LN substrate 31 is patterned so that plurality of SAW devices 10 are formed on LN substrate 31.

Figure 3B:
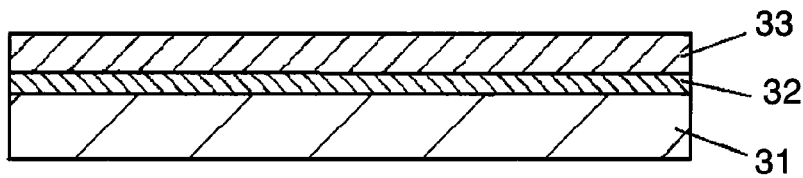
FIG. 3B is a schematic sectional view to illustrate a method of manufacturing the electronic component of FIG. 1.

Next, as shown in FIG. 3B, first resist film 33 is formed on an upper surface of electrode film 32.

Figure 3C:
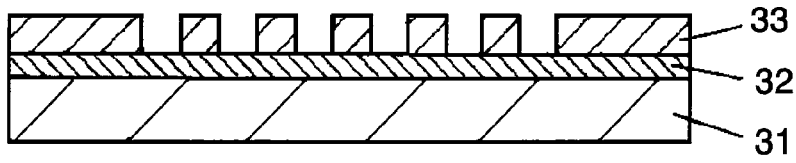
FIG. 3C is a schematic sectional view to illustrate a method of manufacturing the electronic component of FIG. 1.

Next, as shown in FIG. 3C, first resist film 33 is processed into predetermined shapes by using an exposure-development technique or the like.

Figure 3D:
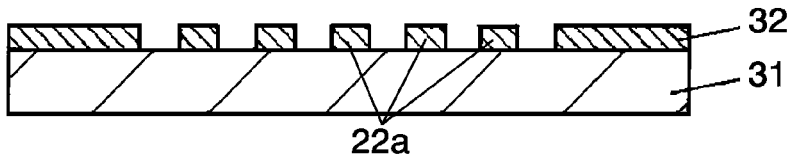
FIG. 3D a schematic sectional view to illustrate a method of manufacturing the electronic component of FIG. 1.

Next, as shown in FIG. 3D, electrode film 32 is processed into predetermined shapes of electrode finger 22a of IDT 22, reflector electrode 3, or the like, by using a dry-etching technique or the like. Thereafter, first resist film 33 is removed.

Figure 3E:
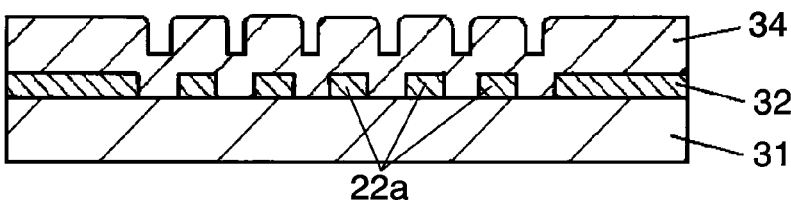
FIG. 3E a schematic sectional view to illustrate a method of manufacturing the electronic component of FIG. 1.

Next, as shown in FIG. 3E, a film of SiO₂ is formed so as to cover electrode film 32 by a method such as vapor deposition or sputtering. Thus, protective film 34 is formed.

Figure 3F:
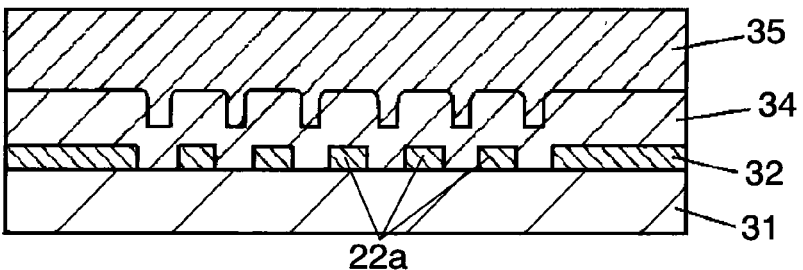
FIG. 3F a schematic sectional view to illustrate a method of manufacturing the electronic component of FIG. 1.

Next, as shown in FIG. 3F, second resist film 35 is formed on the surface of protective film 34.

Figure 3G:
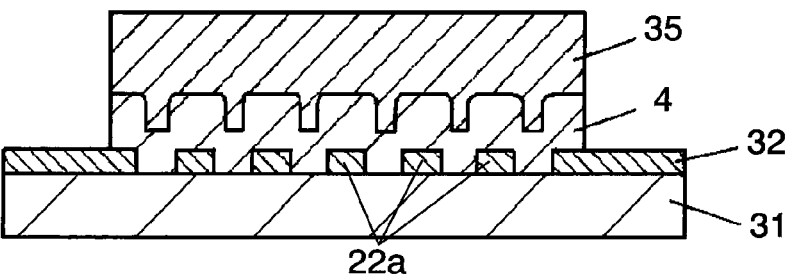
FIG. 3G a schematic sectional view to illustrate a method of manufacturing the electronic component of FIG. 1.

Next, as shown in FIG. 3G, second resist film 35 is processed into predetermined shapes by using the exposure-development technique or the like. In addition, unnecessary portions of protective film 34 is removed by using the dry-etching technique or the like, and protective film 4 having opening for pad 5 or the like is formed.

Figure 3H:
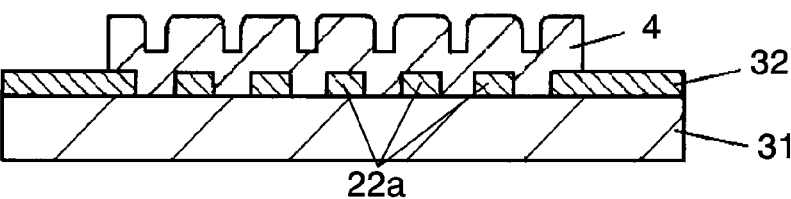
FIG. 3H a schematic sectional view to illustrate a method of manufacturing the electronic component of FIG. 1.

Next, as shown in FIG. 3H, second resist film 35 is removed.

Finally, although not shown, a plurality of SAW devices 10 formed on LN substrate 31 are divided into individual SAW devices 10 by a method, for example, dicing. Thereafter, SAW device 10 is mounted on a ceramic package by a method, for example, die bonding. Then, SAW device 10 is subjected to wire bonding, and then, a lid is welded to carry out hermetic sealing.

In SAW device 10 manufactured as mentioned above in accordance with the first exemplary embodiment of the present invention, the shapes and the dimensions of IDT 22 and protective film 4 satisfy the relations: L1≦p1 and L2≧p2. As a method of obtaining the shapes of IDT 22 and protective film 4 satisfying these relations, a bias sputtering method is used. The bias sputtering method is a method of forming a film by sputtering while applying a bias voltage to electrode film 32 on the side of the substrate in the formation of SiO₂ protective film 34 in FIG. 3E. When protective film 34 is formed, the shape of SiO₂ protective film 34 is controlled by allowing the ratio of the bias voltage applied to electrode film 32 and sputtering electric power to be variable.

In the first exemplary embodiment, firstly, in order to examine what shape the SiO₂ protective film is formed into leads to obtaining excellent characteristics when protective film 4 is formed, the following four kinds of SAW devices (an example 1 and comparative examples 1 to 4) are formed. Note here that h/(2×p)=h/λ is defined as an electrode normalized film thickness, and t/(2×p)=t/λ is defined as an SiO₂ normalized film thickness.

A SAW device of the comparative example 1 has the electrode normalized film thickness of 4% and is not provided with the SiO₂ protective film. A SAW device of the comparative example 2 has the electrode normalized film thickness of 4.5% and is not provided with the SiO₂ protective film. A SAW device of the comparative example 3 has the electrode normalized film thickness of 4% and is provided with the SiO₂ protective film whose shape satisfies the relations: L1>p1 and L2<p2. A SAW device of the comparative example 4 has the electrode normalized film thickness of 4.5% and is provided with the SiO₂ protective film whose shape satisfies the relations: L1>p1 and L2<p2. Furthermore, SAW device 10 of the example 1 has the electrode normalized film thickness of 4.5% and is provided with the SiO₂ protective film whose shape satisfies the relations: L1≦p1 and L2≧p2.

Note here that the SiO₂ normalized film thickness: t/(2×p) in SAW device 10 of the example 1 and the SAW devices of the comparative examples 3 and 4 as mentioned above are all 20%.

Figure 4:
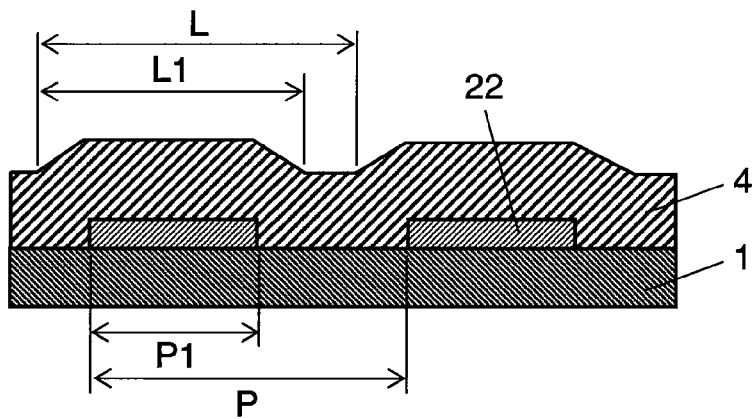
FIG. 4 is a sectional view showing an electronic component in a comparative example 3 of the present invention.
Figure 5:
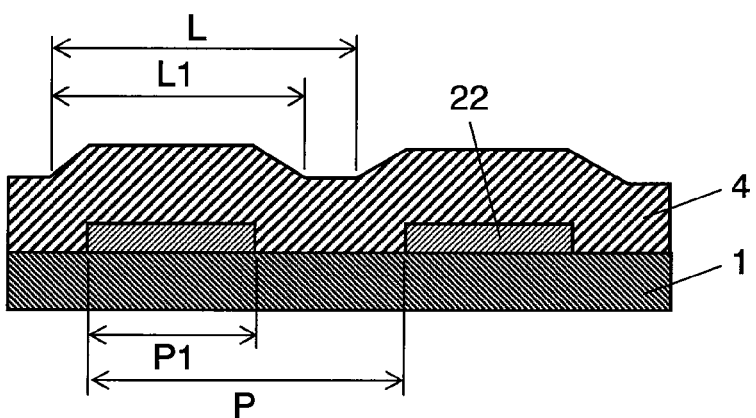
FIG. 5 is a sectional view showing an electronic component in a comparative example 4 of the present invention.
Figure 6:
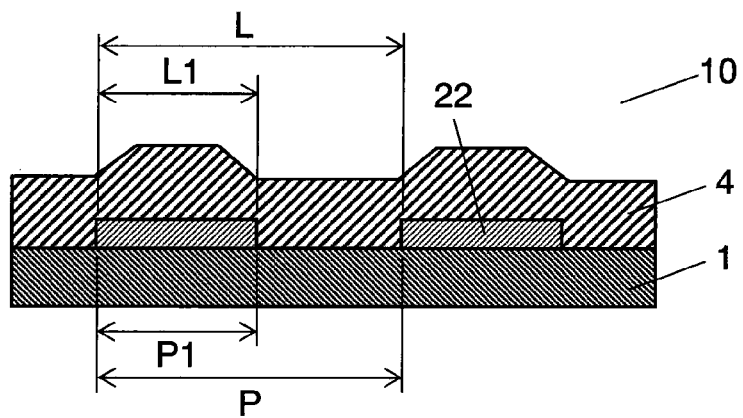
FIG. 6 is a sectional view showing an electronic component in an example 1 of the present invention.
Figure 7:
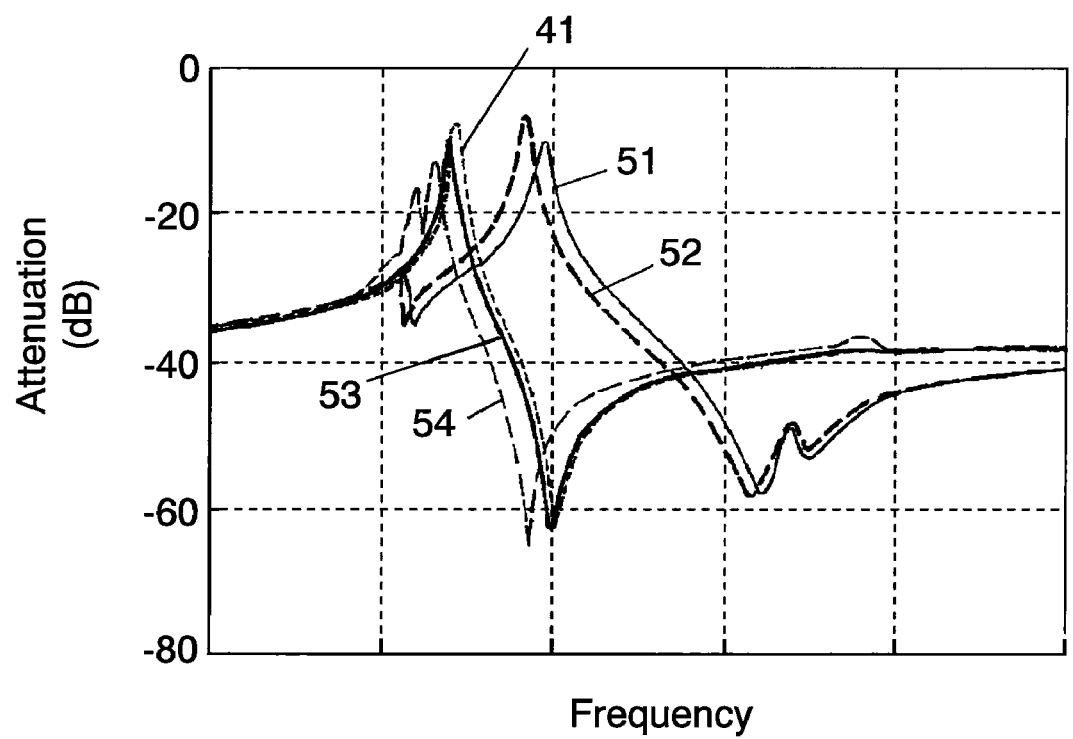
FIG. 7 is a graph showing electrical characteristics of the electronic component of FIG. 6.

Furthermore, FIG. 4 shows a sectional shape of the SAW device of the comparative example 3; FIG. 5 shows a sectional shape of the SAW device of the comparative example 4; and FIG. 6 shows a sectional shape of SAW device 10 of the example 1. In addition, FIG. 7 is a graph showing the electrical characteristics of the SAW devices, respectively. Segment line 41 shows the characteristic of the example 1. Segment lines 51, 52, 53 and 54 show the characteristics of the comparative examples 1, 2, 3, and 4, respectively. Furthermore, the sectional shape of each SAW device is identified from the results of observation in which the surface of the SAW device is coated with metal and carbon, the electrode is cut by FIB (Focused Ion Beam) in the direction in which the surface acoustic wave propagates, and then observation by the use of an electron microscope is carried out.

As shown in FIG. 7, in the comparative examples 1 and 2 in which the SiO₂ protective film is not provided, spurious caused by Rayleigh wave is generated and an anti-resonant frequency is divided, showing very bad characteristics. In the comparative examples 3 and 4, the shapes of the SiO₂ protective films satisfy the relations: L1>p1 and L2<p2. In the comparative example 3, spurious around the resonance frequency is not observed. However, in the comparative example 4, spurious is generated at the side of frequency lower than the resonance frequency and the insertion loss in the resonance frequency is extremely bad. Furthermore, in the example 1 in which the shape of the SiO₂ protective film satisfies the relations: L1≦p1 and L2≧p2, spurious around the resonance frequency is not observed. Furthermore, the insertion loss in the example 1 is remarkably improved as compared with the insertion loss in the comparative examples 3 and 4.

Next, for comparison, SAW devices of a comparative example 5 and an example 2 are produced. A SAW device of the comparative example 5 has the electrode normalized film thickness of $3\% \leq h/(2 \times p) \leq 9\%$ and the shape of the $SiO_2$ protective film satisfying the relations: $L1>p1$ and $L2<p2$. SAW device 10 of the example 2 has the electrode normalized film thickness of 4.5% $h/(2 \times p) \leq 9\%$ and the shape of the $SiO_2$ protective film satisfying the relations: $L1 \leq p1$ and $L2 \geq p2$. In the electrode normalized film thickness, 4.5% $h/(2 \times p) \leq 9\%$ means $0.045 \leq h/(2 \times p)$ 0.09. The same is true in the condition relations mentioned below.

Figure 8A:
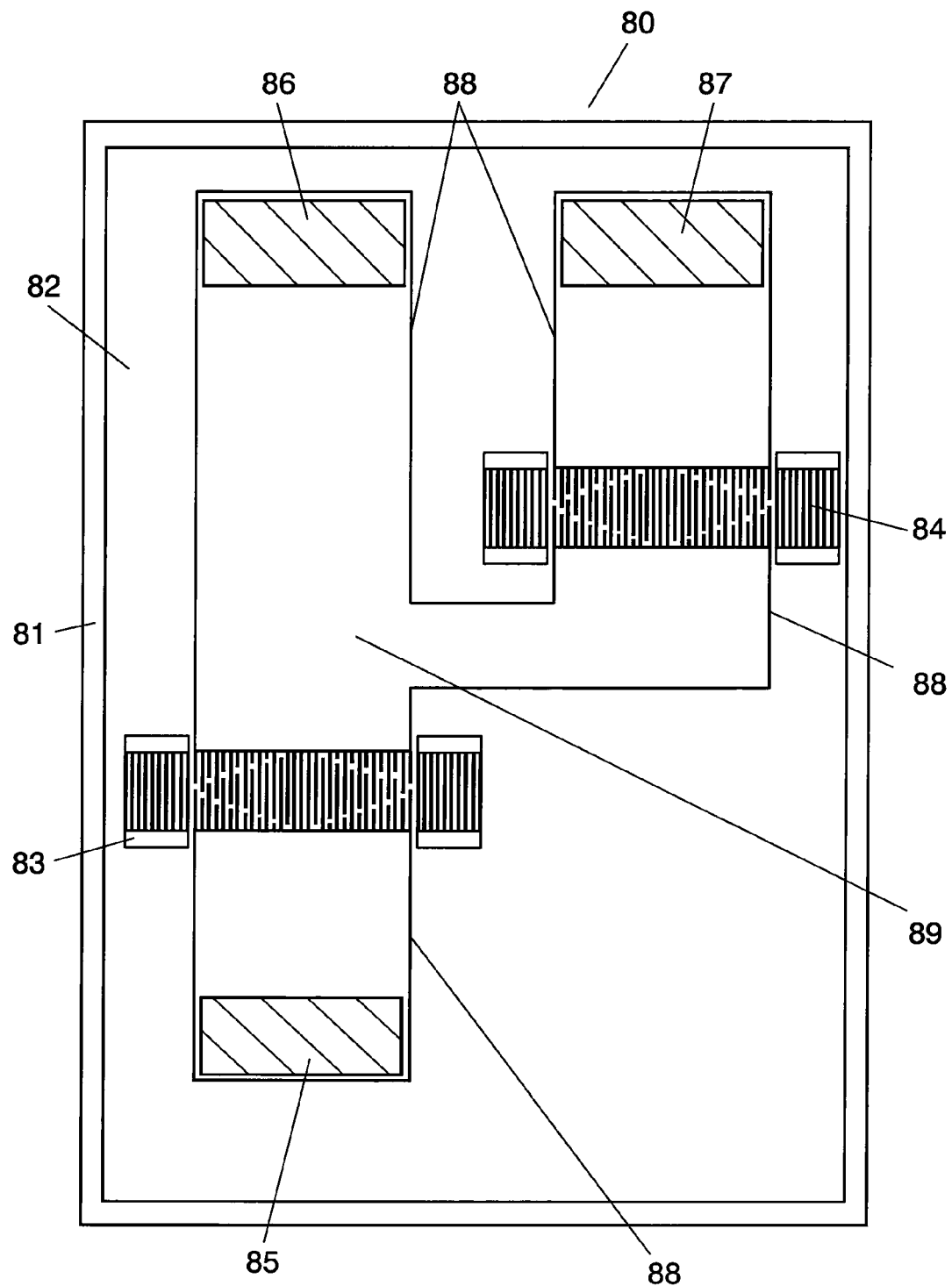
FIG. 8A is a top view showing a configuration of an electronic component in accordance with the first exemplary embodiment of the present invention.

The SAW device satisfying the conditions of the example 2 is produced as shown in FIG. 8A as an L-type filter in which SAW devices 10 shown in FIG. 1 are connected in serial-parallel arrangement. Similarly, the SAW device satisfying the conditions of the comparative example 5 is produced as shown in FIG. 8A as an L-type filter. As shown in FIG. 8A, surface acoustic wave filter 80 (hereinafter, referred to as "filter 80") is formed on substrate 81 made of the LN substrate and includes serially connected surface acoustic wave device 83 (hereinafter, referred to as "SAW device 83") and parallel connected surface acoustic wave device 84 (hereinafter, referred to as "SAW device 84"). Furthermore, by using SAW device 10 for at least one of SAW device 83 and SAW device 84, the effect and advantage of the present invention can be obtained.

Furthermore, when filter 80 shown in FIG. 8A is produced by using SAW device 10, pitch p between the electrodes shown in FIG. 2 is adjusted so that the resonance frequency of SAW device 83 coincides with the anti-resonance frequency of SAW device 84.

In addition, filter 80 includes input terminal 85, output terminal 86, ground terminal 87 and line 88 on substrate 81. SAW device 83 is disposed between input terminal 85 and output terminal 86. Line 88 connects input terminal 85 to SAW device 83 and connects SAW device 83 to output terminal 86. Furthermore, branch point 89 is provided between input terminal 85 and output terminal 86. SAW device 84 is disposed between branch point 89 and ground terminal 87. Then, line 88 connects branch point 89 to SAW device 84 and connects SAW device 84 to ground terminal 87. SAW device 83 and SAW device 84 connected in this way are called serial connection and parallel connection, respectively. Furthermore, SAW device 83 and SAW device 84 are covered with protective film 82.

Figure 9:
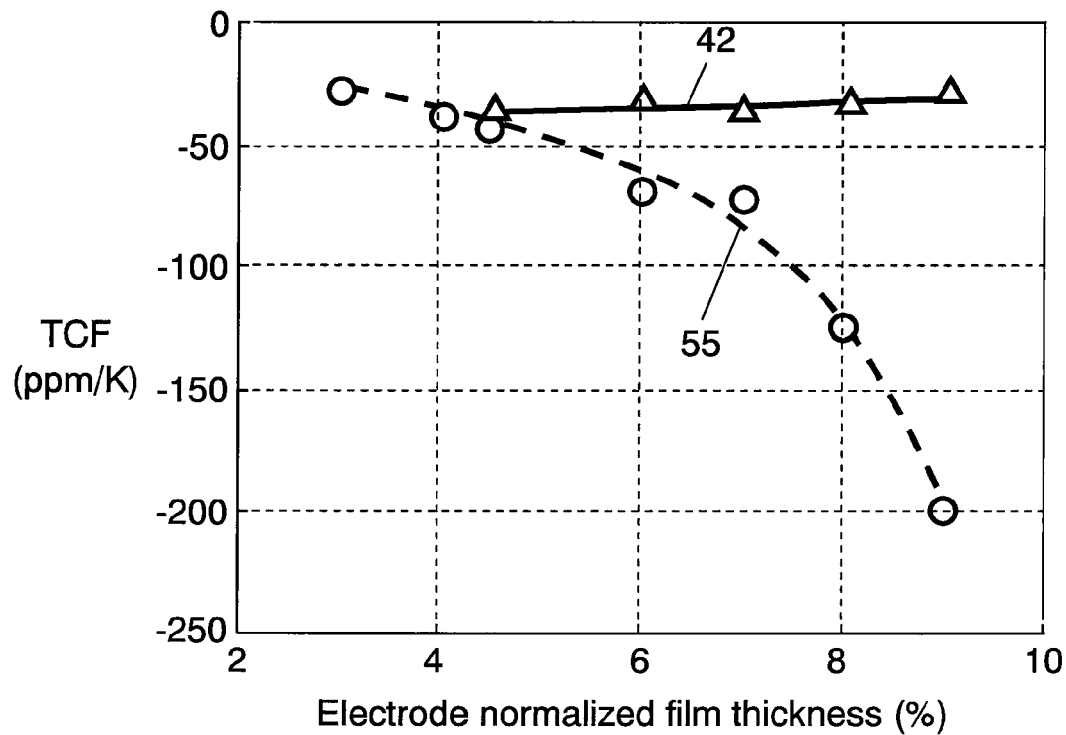
FIG. 9 is a graph showing a temperature coefficient of frequency of the electronic component of FIG. 8A.

In addition, FIG. 9 shows the temperature coefficient of frequency (TCF) measured in the center frequency in the filter properties of the SAW devices satisfying the conditions of the comparative example 5 and the example 2. In FIG. 9, line segment 42 shows the temperature coefficient of frequency of the example 2 and line segment 55 shows the temperature coefficient of frequency of the comparative example 5. Note here that the temperature coefficient of frequency (TCF) is one of the physical properties determined by the temperature coefficient and the thermal expansion coefficient of the dielectric constant with respect to the surrounding temperature and expressed by the rate of change per K (ppm/K). It is shown that as the value of temperature coefficient of frequency (TCF) is smaller, the SAW device can be stably used in the wider temperature range.

As shown in FIG. 9, in the SAW device of the comparative example 5 in which the shape of the $SiO_2$ protective film satisfies the relations: $L1>p1$ and $L2<p2$, when the electrode normalized film thickness is increased, the temperature coefficient of frequency is deteriorated. However, in SAW device 10 of the example 2 in which the shape of $SiO_2$ protective film 4 satisfies the relations: $L1 \leq p1$ and $L2 \geq p2$, even if the electrode normalized film thickness is increased, the temperature coefficient of frequency is still excellent. In particular, the higher the electrode normalized film thickness is, the larger the effect becomes.

Figure 8B:
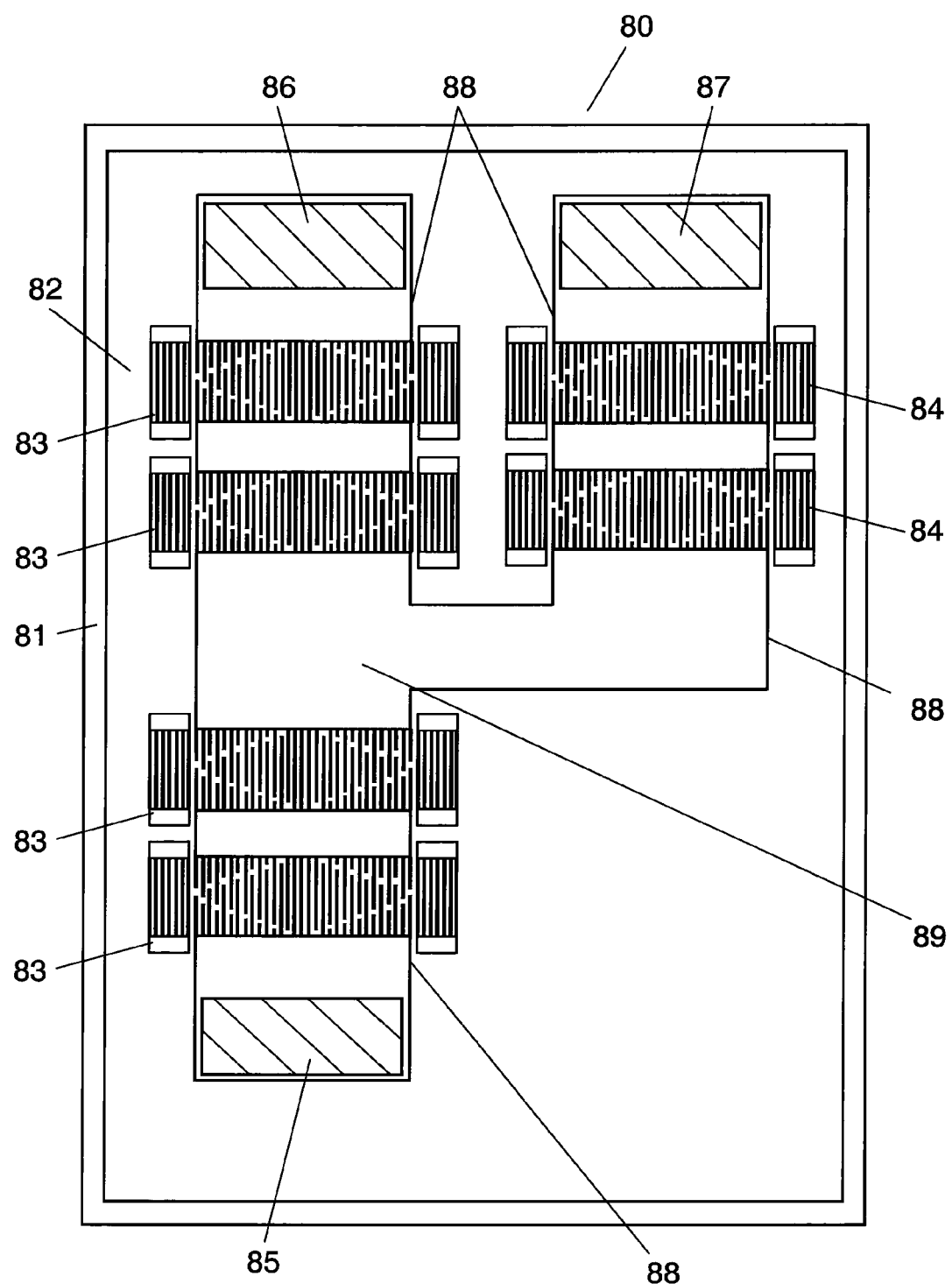
FIG. 8B is a top view showing a configuration of another electronic component in accordance with the first exemplary embodiment of the present invention.

Furthermore, FIG. 8B is a top view showing a ladder type surface acoustic filter as another electronic component in accordance with the first exemplary embodiment. As shown in FIG. 8B, ladder type surface acoustic wave filter 80 includes a plurality of serially connected surface acoustic wave devices 83 and a plurality of parallel connected surface acoustic wave devices 84 on substrate 81. Furthermore, filter 80 includes input terminal 85, output terminal 86, ground terminal 87 and line 88 on substrate 81. The plurality of SAW devices 83 are disposed between input terminal 85 and output terminal 86. Line 88 connects input terminal 85 to SAW device 83, connects SAW device 83 to output terminal 86, and connects between SAW devices 83. Furthermore, branch portion 89 is provided between input terminal 85 and output terminal 86. The plurality of SAW devices 84 are disposed between branch point 89 and ground terminal 87. Then, line 88 connects branch point 89 to SAW device 84, connects SAW device 84 to ground terminal 87, and connects between SAW devices 84. SAW devices 83 and SAW devices 84 connected in this way are called serial connection and parallel connection, respectively. Furthermore, SAW devices 83 and SAW devices 84 are covered with protective film 82. Pitch p between electrodes is adjusted so that the resonance frequency of SAW device 83 coincides with the anti-resonance frequency of SAW device 84. Furthermore, by using SAW device 10 for at least one of the plurality of SAW devices 83 and the plurality of SAW devices 84, the effect and advantage of the present invention can be obtained. Filter 80 shown in FIG. 8B includes four SAW devices 83, two SAW devices 84 and one branch point 89. However, filter 80 is not limited to this configuration. The combination of SAW device 83, SAW device 84 and branch point 89 may be determined depending upon characteristics required by filter 80.

Figure 8C:
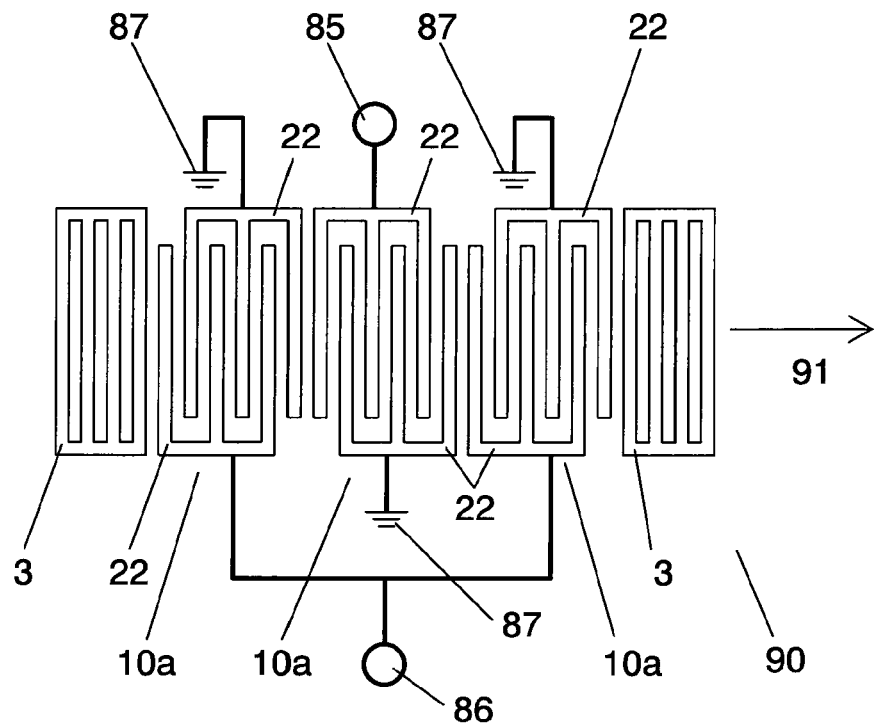
FIG. 8C is a schematic configuration view showing a configuration of a further electronic component in accordance with the first exemplary embodiment of the present invention.

Furthermore, FIG. 8C is a schematic configuration view showing a longitudinal mode binding type surface acoustic wave filter as another electronic component in accordance with the first exemplary embodiment. As shown in FIG. 8C, longitudinal mode binding type surface acoustic wave filter 90 (hereinafter, referred to as "filter 90") includes a plurality of surface acoustic wave devices 10a (hereinafter, referred to as "SAW devices 10a") disposed along the direction in which the surface acoustic wave propagates (in the direction shown by an arrow 91). In addition, IDTs 22 constituting neighboring SAW devices 10a are in adjacent to each other. Furthermore, SAW device 10a includes a pair of IDTs 22 facing each other. The difference between SAW device 10a and SAW device 10 is in that individual SAW device 10a does not include a pair of reflector electrodes 3 respectively but filter 90 as a whole includes a pair of reflector electrodes 3. Therefore, similar to SAW device 10, SAW device 10a has a configuration in which the shape of $SiO_2$ protective film 4 satisfies the relations: $L1 \leq p1$ and $L2 \geq p2$. In addition, SAW device 10a has the same configuration as SAW device 10 in terms of the conditions such as the electrode normalized film thickness. Thus, also in the configuration of filter 90, the same effect and advantage as those of SAW device 10 can be exhibited. Note here that filter 90 shown in FIG. 8C includes three SAW devices 10a. However, filter 90 is not necessarily limited to this configuration. A plurality of SAW devices 10a may be disposed along the direction in which a surface acoustic wave propagates (in the direction shown by arrow 91). Furthermore, it is not necessary that SAW device 10a is used in all the surface acoustic wave devices. At least one surface acoustic wave device may be SAW device 10a.

As mentioned above, when protective film 4 is formed so that the electrode normalized film thickness is $h/(2 \times p) \geq 4.5\%$ and the shape of $SiO_2$ protective film 4 satisfies the relations: $L1 \leq p1$ and $L2 \geq p2$, it is possible to obtain SAW devices 10 and 10a having an excellent temperature characteristics and an excellent electrical characteristic.

In the first exemplary embodiment, Al or an Al alloy is used for electrode film 32. However, materials of electrode film 32, that is, electrode finger 22a of IDT 22 and reflector electrode 3 are not limited to these materials. For example, a heavy metal having a higher density than Al, for example, Ti, Cu, W, Ag, Au, or the like, may be used. In addition, an ally including a metal having a higher density than Al as a main component may be used.

Figure 10:
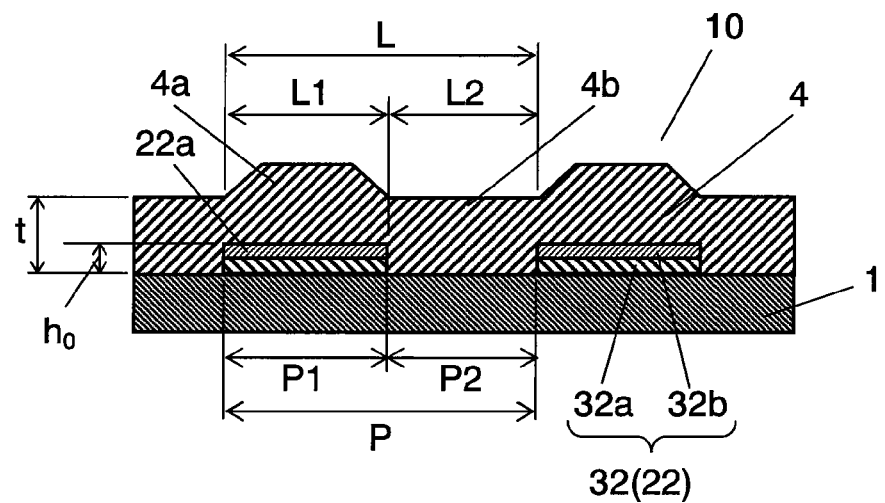
FIG. 10 is a partial sectional view showing a section of another electronic component in accordance with the first exemplary embodiment of the present invention.

Furthermore, as shown in FIG. 10, electrode film 32 may be formed by laminating first electrode film 32a and second electrode film 32b. For example, Al or an Al alloy may be used for first electrode film 32a, and a material having a higher density than Al, for example, Ti, Cu, W, Ag, Au, or the like, or an alloy including such materials as a main component may be used for second electrode film 32b. Furthermore, alternatively, a material having a higher density than Al, for example, Ti, Cu, W, Ag, Au, or the like, or an alloy including such materials as a main component may be used for first electrode film 32a, and Al or an Al alloy may be used for second electrode film 32b. When a metal having a higher density than Al is used for first electrode film 32a or second electrode film 32b, or electrode film 32, actual thickness $h_0$ of electrode film 32 for obtaining the predetermined electrode normalized film thickness h is reduced.

Furthermore, as protective film 4, the $SiO_2$ material is used. However, a material of protective film 4 is not limited to the $SiO_2$ material. For example, other dielectric materials such as SiN, SiON, $Ta_2O_5$, and $TeO_2$ may be used. In addition, combinations of such dielectric materials may be used. That is to say, as long as the shape of protective film 4 made of a dielectric material satisfies the conditions of $L1 \leq p1$ and $L2 \geq p2$, the same effects can be obtained.

In the first exemplary embodiment, IDT 22 is weighted by apodization. However, as to the weighting ratio by apodization is not limited to the configuration shown in FIG. 1. When the weighting ratio is 0, that is to say, when the weighting is not carried out at all, SAW device 10 is a normal type resonator. Furthermore, the number of pairs of IDTs 22 and the number of reflector electrodes 3 disposed on both sides of IDT 22 are not limited to those shown in FIG. 1. Note here that the ratio of weighting by apodization means a ratio of a region of IDT 22 in which the crossing width of electrode finger 22a is different from the width of SAW device 10.

Furthermore, as the method of forming protective film 4, the bias sputtering method is used. However, the method of forming protective film 4 is not limited to the bias sputtering method. Other methods of forming protective film 4 may be used.

Second Exemplary Embodiment

A SAW device as an electronic component in accordance with a second exemplary embodiment of the present invention is described with reference to drawings.

The same reference numerals are given to the same configurations of the second exemplary embodiment as those of the first exemplary embodiment, and the detailed description thereof is omitted.

Figure 11:
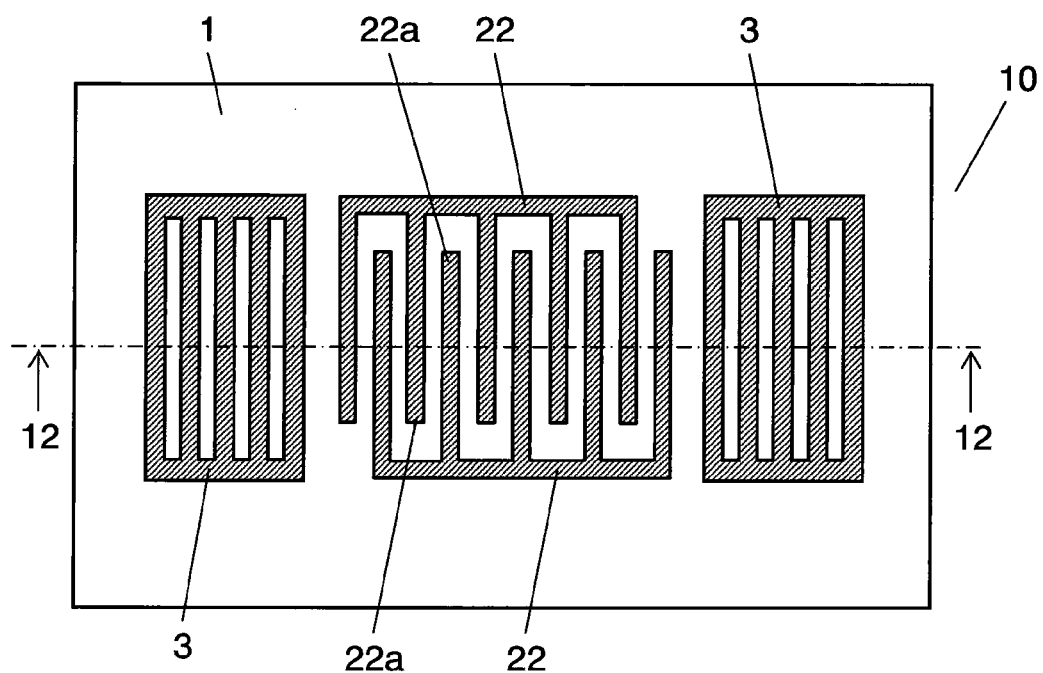
FIG. 11 is a top view showing a main part of an electronic component in accordance with a second exemplary embodiment of the present invention.
Figure 12:
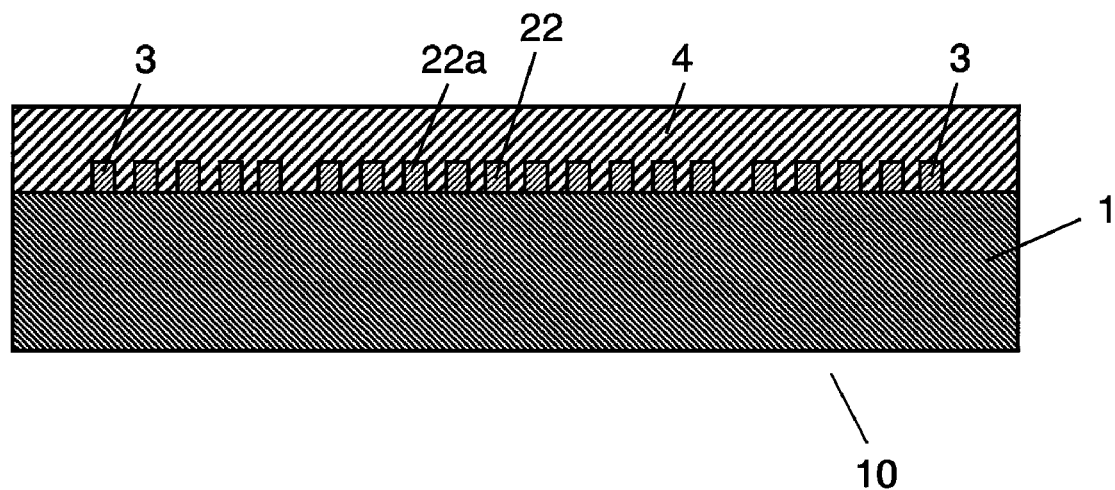
FIG. 12 is a sectional view of the electronic component taken along line 12-12 of FIG. 11.
Figure 13:
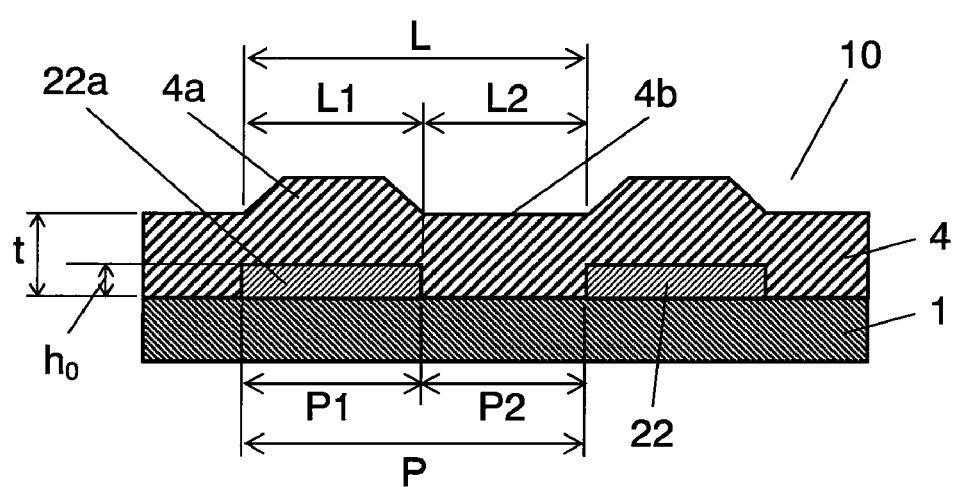
FIG. 13 is a partial sectional view showing the electronic component of FIG. 11.

FIG. 11 is a top view showing a main part of a SAW device as an electronic component in accordance with the second exemplary embodiment of the present invention. FIG. 12 is a sectional view of the SAW device taken along line 12-12 of FIG. 11. Similar to FIG. 12, FIG. 13 is a sectional view showing the SAW device. In FIGS. 11 and 12, SAW device 10 includes substrate 1, IDT 22, reflector electrode 3 and protective film 4. IDT 22 and reflector electrode 3 are provided on the upper surface of substrate 1 and includes Al or an Al alloy. Protective film 4 is made of $SiO_2$ and covers IDT 22 and reflector electrode 3. Also, protective film 4 has the uneven shape on the surface thereof.

Furthermore, the equivalent film thickness of aluminum of IDT 22 is h. Furthermore, a value of an electrode normalized film thickness: $h/(2 \times p) = h/\lambda$ is $7.8\% \leq h/(2 \times p) \leq 9.8\%$. Note here that wavelength: $\lambda = 2 \times p$ is a wavelength in the operation center frequency of the surface acoustic wave in SAW device 10.

Furthermore, substrate 1 is made of lithium niobate cut out from a Y-plate rotated by D degree around the X-axis in the Z-axis direction. Rotation angle D satisfies $-25$ degree$\leq D \leq +25$ degree, and further preferably, 0 degree$\leq D \leq +25$ degree.

Similar to SAW device 10 in accordance with the first exemplary embodiment, SAW device 10 in accordance with the second exemplary embodiment satisfies the relations: $L1 \leq p1$ and $L2 \geq p2$.

A method of manufacturing SAW device 10 in accordance with the second exemplary embodiment is the same as the method of manufacturing SAW device 10 in accordance with the first exemplary embodiment described with reference to FIGS. 3A to 3H. Therefore, the detailed description is omitted.

Figure 14:
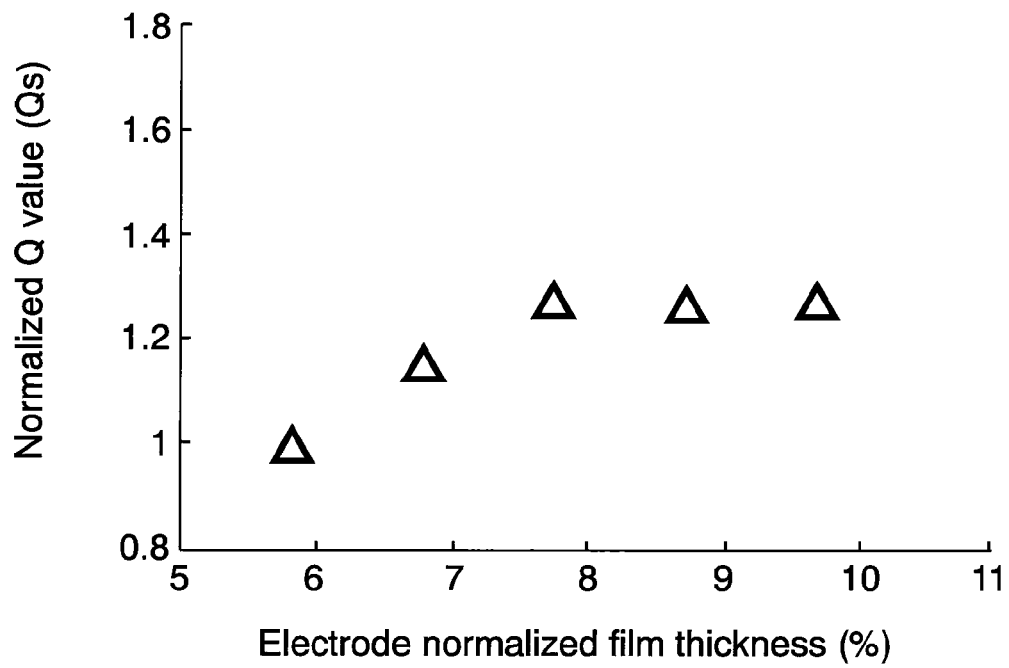
FIG. 14 is a characteristic graph showing a relation between an electrode normalized film thickness and a Q value of a resonance point of the electronic component in accordance with the second exemplary embodiment of the present invention.
Figure 15:
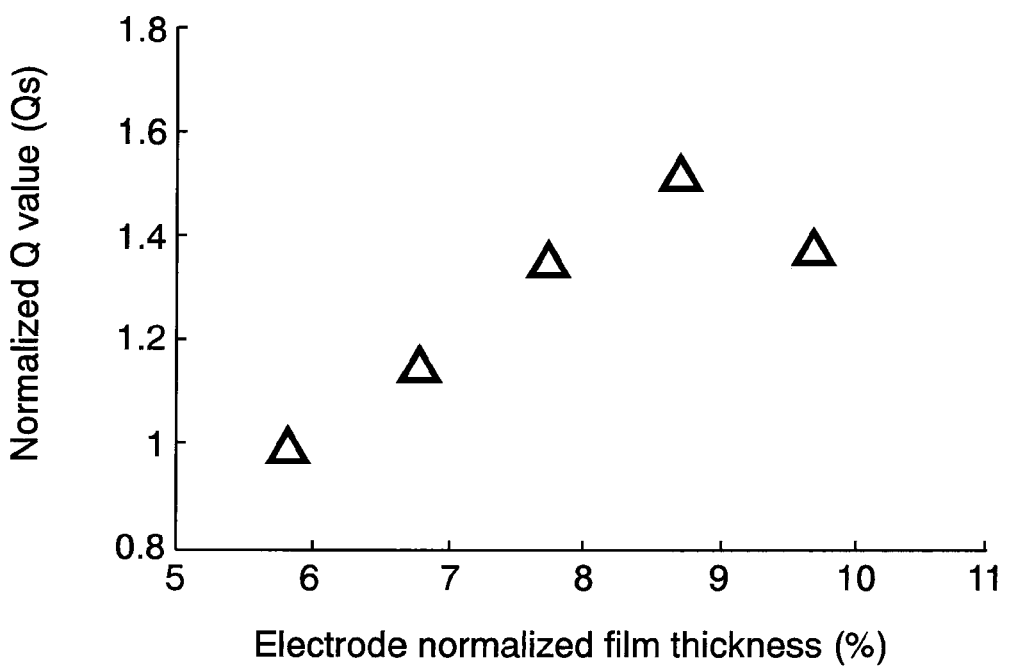
FIG. 15 is a characteristic graph showing a relation between a electrode normalized film thickness and a Q value of an anti-resonance point of the electronic component in accordance with the second exemplary embodiment of the present invention.
Figure 16:
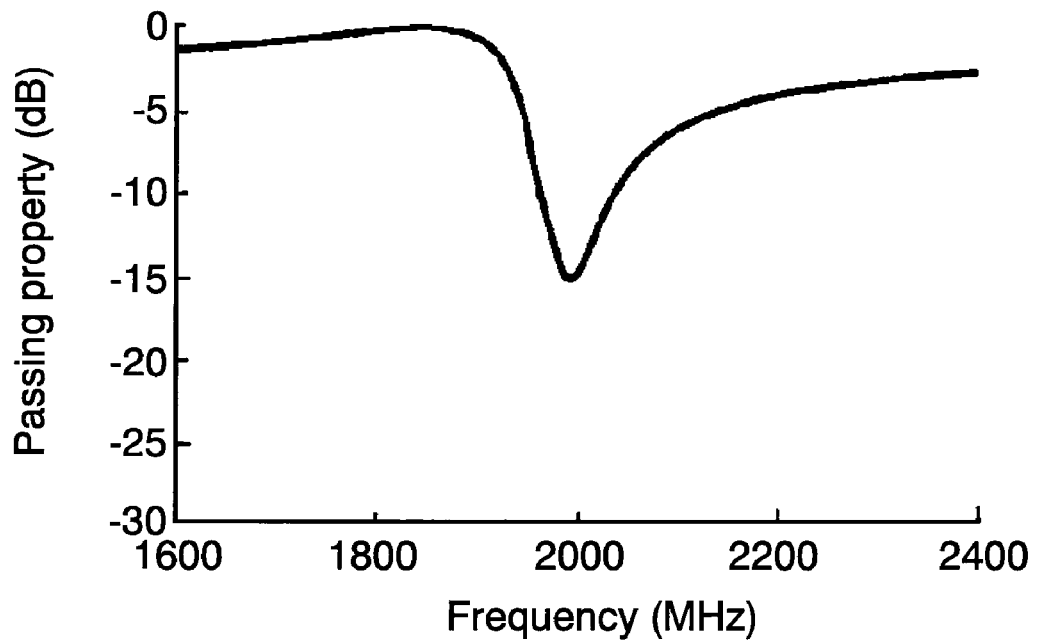
FIG. 16 is a characteristic graph showing a passing property of the electronic component in accordance with the second exemplary embodiment of the present invention.
Figure 17:
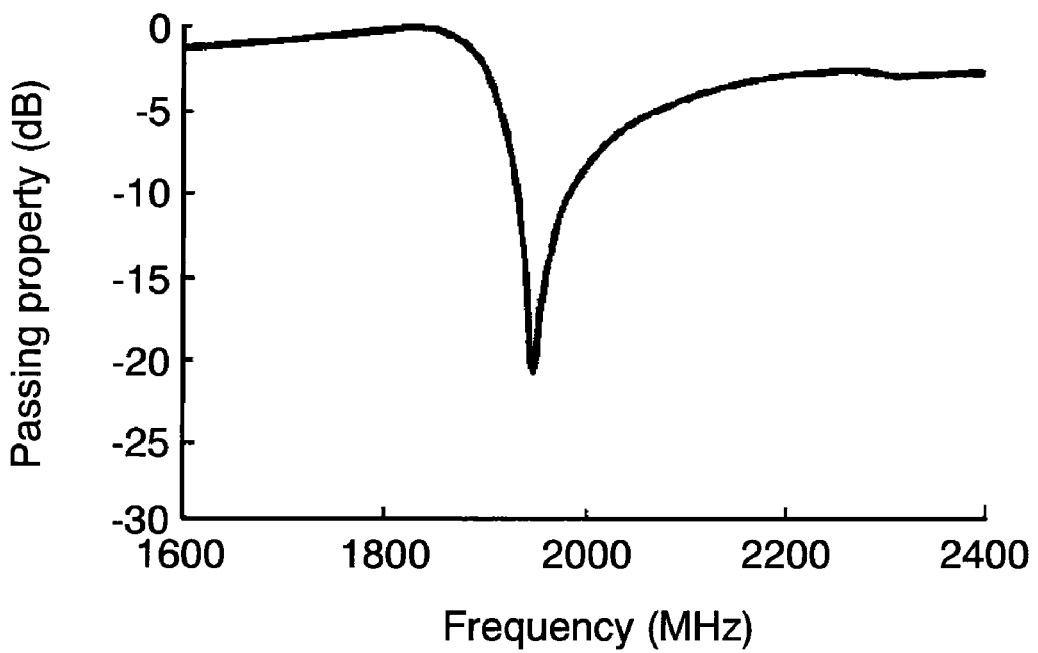
FIG. 17 is a characteristic graph showing a passing property of the electronic component in accordance with the second exemplary embodiment of the present invention.
Figure 18:
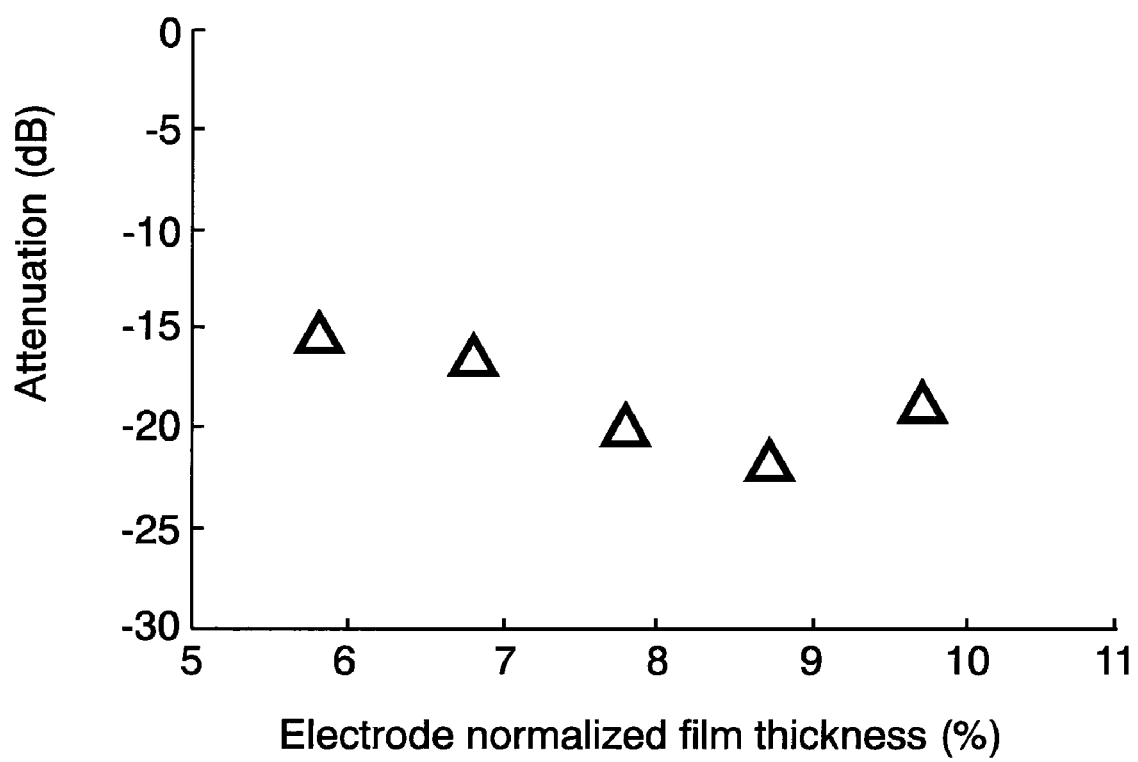
FIG. 18 is a characteristic graph showing a relation between an electrode normalized film thickness and attenuation of the electronic component in accordance with the second exemplary embodiment of the present invention.

Next, FIG. 14 shows a relation between the electrode normalized film thickness and normalized Qs as a Q value of a resonance point of SAW device 10 in accordance with the second exemplary embodiment of the present invention. FIG. 15 shows a relation between the electrode normalized film thickness of SAW device 10 and normalized Qp as a Q value of an anti-resonance point. FIGS. 16 and 17 show a passing property of SAW device 10. FIG. 18 shows a relation between the electrode normalized film thickness of SAW device 10 and an attenuation. Herein, normalized Qs and normalized Qp are normalized by using Qs and Qp when the electrode normalized film thickness is 5.8%.

Note here that protective film 4 uses $SiO_2$. In film thickness t of $SiO_2$ protective film 4, the $SiO_2$ normalized film thickness: $t/(2 \times p) = t/\lambda$ is 20%.

As shown in FIGS. 14 and 15, when the electrode normalized film thickness satisfies $7.8\% \leq h/(2 \times p) \leq 9.8\%$, normalized Qs and normalized Qp are 1.2 or more. Thus, SAW device 10 having a high Q value can be obtained. In particular, when the electrode normalized film thickness satisfies $8.5\% \leq h/(2 \times p) \leq 9.0\%$, the Q value becomes highest.

Furthermore, FIGS. 16 and 17 show the passing property of SAW device 10. FIG. 17 shows the passing property when the electrode normalized film thickness is 8.7%. Furthermore, FIG. 16 shows the passing property when the electrode normalized film thickness is 5.8%. As shown in FIGS. 16 and 17, the attenuation of SAW device 10 when the electrode normalized film thickness is in the range of $7.8\% \leq h/(2 \times p) \leq 9.8\%$ is larger by about 6 dB as compared with the attenuation of SAW device 10 when the electrode normalized film thickness is 5.8%. Note here that the displacement of the frequency is caused by the difference in the electrode normalized film thickness. The configurations of the SAW devices such as the number of pairs, crossing width, or the like, of IDT 22 have the substantially same characteristics. Furthermore, as shown in FIG. 18, when the electrode normalized film thickness is in the range of 7.8%≦h/(2×p)≦9.8%, the attenuation is larger by about 5 dB or more as compared with the case in which the electrode normalized film thickness is 5.8%. In particular, when the electrode normalized film thickness is in the range of 8.5%≦h/(2×p)≦9.0%, the most excellent property also in terms of the attenuation is exhibited.

Figure 19:
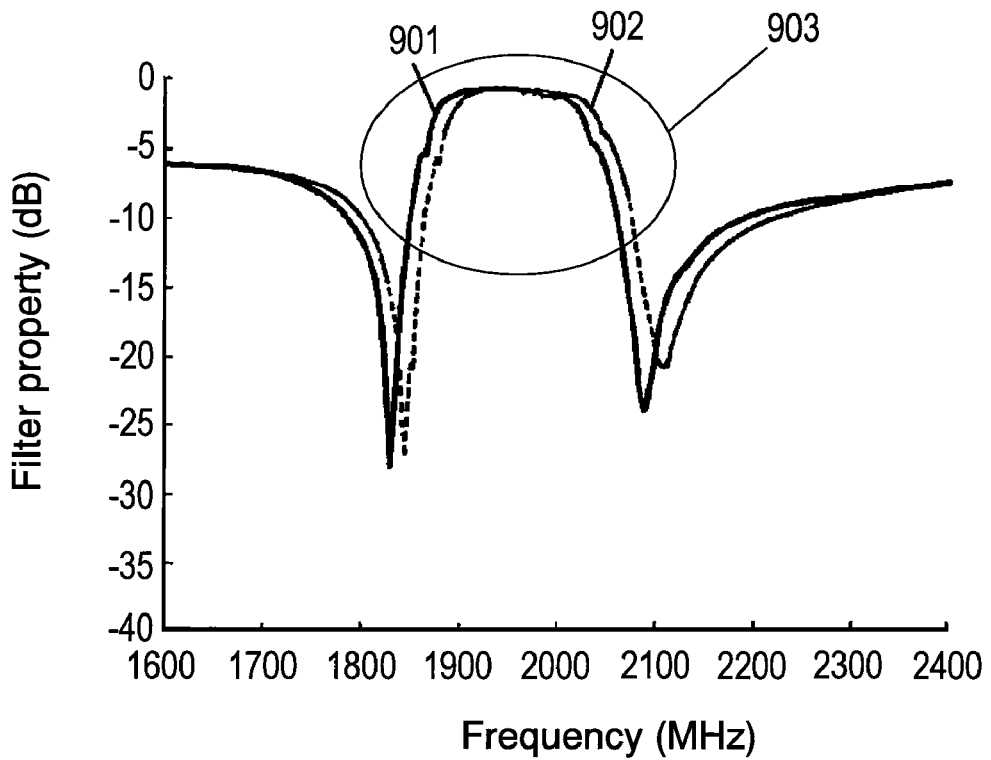
FIG. 19 is a characteristic graph showing a filter property of a ladder-type filter in accordance with the second exemplary embodiment of the present invention.
Figure 20:
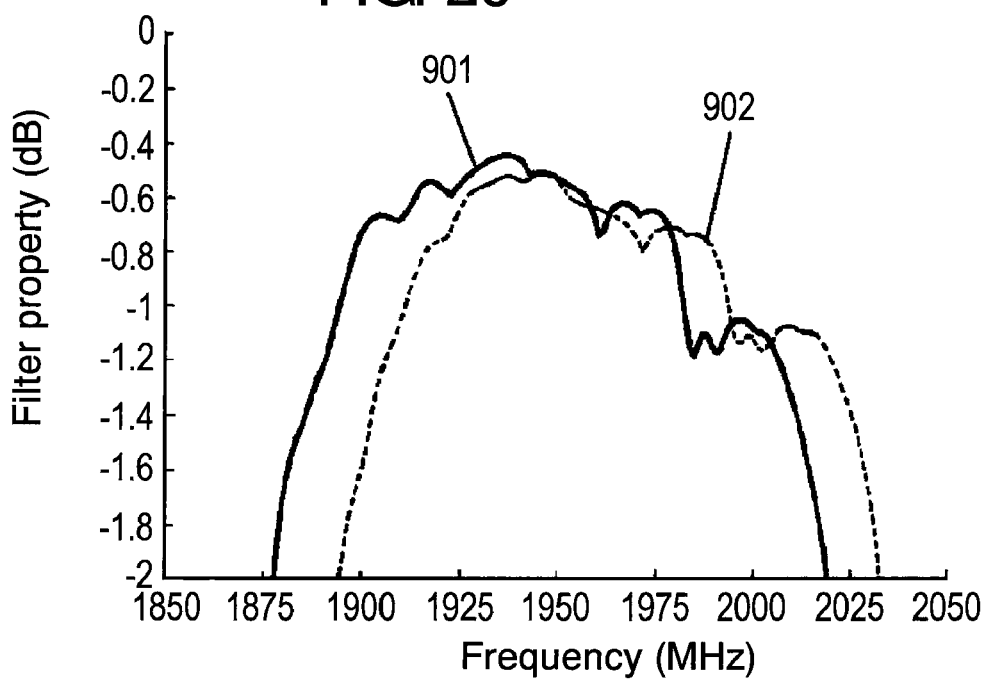
FIG. 20 is a characteristic graph showing a filter property of a ladder-type filter in accordance with the second exemplary embodiment of the present invention.

FIGS. 19 and 20 show the filter property of a ladder-type filter in which SAW devices 10 are connected like a ladder. An example of the ladder type filter includes a configuration of filter 80 having one stage of serial SAW device 83 and one stage of parallel SAW device 84, as shown in FIG. 8A. FIG. 20 is an enlarged view enlarging part 903 of the filter property shown in FIG. 19. Furthermore, in FIGS. 19 and 20, line segment 901 shows the filter property when the electrode normalized film thickness of parallel SAW device 84 is 7.8% and the electrode normalized film thickness of serial SAW device 83 is 8.3%. Furthermore, line segment 902 shows the filter property when the electrode normalized film thickness of parallel SAW device 84 is 5.8% and the electrode normalized film thickness of serial SAW device 83 is 6.2%. As shown in FIGS. 19 and 20, when the electrode normalized film thickness is in the range of 7.8%≦h/(2×p)≦9.8%, the insertion loss is improved by 0.1 dB. Note here that the displacement of the frequency is caused by the difference in the electrode normalized film thickness. The configurations of the SAW devices such as the number of pairs, crossing width, or the like, of IDT 22 have the substantially same characteristics.

Furthermore, as protective film 4, the $SiO_2$ material is used. However, a material of protective film 4 is not limited to the $SiO_2$ material. For example, other dielectric materials such as SiN, SiON, $Ta_2O_5$, and $TeO_2$ may be used. In addition, combinations of such dielectric materials may be used.

Furthermore, when SAW device 10 constitutes an antenna duplexer as an SAW filter, pitch p of electrode finger 22a may be different between a transmitting SAW filter and a receiving SAW filter. In this case, when electrode film thicknesses h are equal to each other, the electrode normalized film thickness h/(2×p) becomes different. Therefore, by changing the electrode film thicknesses h of the transmitting SAW filter and the receiving SAW filter, respectively, an antenna duplexer having an optimal configuration can be obtained.

Furthermore, when ladder-type filter 80 as shown in FIG. 8A or FIG. 8B is configured, if the pitch of electrode finger 22a is different between serial SAW device 83 and parallel SAW device 84, the electrode normalized film thickness becomes different. In this case, by changing the electrode film thicknesses h in serial SAW device 83 and parallel SAW device 84, a configuration capable of obtaining optimum filter properties can be realized. Furthermore, the conditions of SAW device 10 as shown in FIG. 8C in the second exemplary embodiment can be applied to a SAW device used in a longitudinal mode binding type surface acoustic wave filter.

Third Exemplary Embodiment

A SAW device as an electronic component in accordance with a third exemplary embodiment of the present invention is described with reference to drawings.

In SAW device 10 in accordance with the third exemplary embodiment, SAW device 10 having the same configuration as SAW device 10 used in the first or second exemplary embodiment is used, and filter 80 shown in FIG. 8A is produced. Therefore, since the structure and the manufacturing method of SAW device 10 in the third exemplary embodiment are the same as those of SAW device 10 respectively shown in FIGS. 1, 2 and 3, the detail description is omitted.

Figure 21:
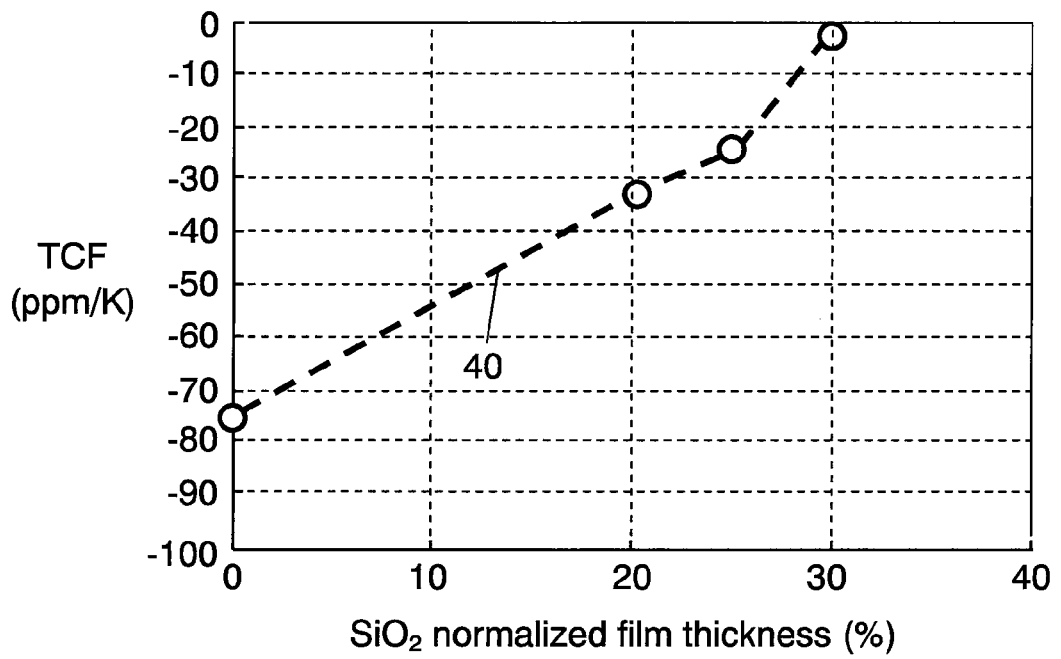
FIG. 21 is a graph showing a temperature coefficient of frequency of an electronic component in accordance with a third exemplary embodiment of the present invention.

In the third exemplary embodiment, in order to clarify the relation between the film thickness of $SiO_2$ protective film 4 and the temperature characteristics, four kinds of SAW devices having different film thicknesses of $SiO_2$ protective film 4 are produced. FIG. 21 shows a relation between the film thickness of $SiO_2$ protective film 4 and the temperature coefficient of frequency. In FIG. 21, line segment 40 shows the relation between the film thickness of $SiO_2$ protective film 4 and the temperature coefficient of frequency. SAW device 10 in accordance with the third exemplary embodiment satisfies the relations: L1≦p1 and L2≧p2. Furthermore, the electrode normalized film thickness h/(2×p) of IDT 22 is 4.5%.

As shown in FIG. 21, as the $SiO_2$ normalized film thickness is increased, the temperature coefficient of frequency is improved. Furthermore, when the $SiO_2$ normalized film thickness t/(2×p) reaches 30%, almost zero temperature coefficient is realized. Therefore, when SAW device 10 is manufactured so that it satisfies the relations: L1≦p1 and L2≧p2 and the film thickness of $SiO_2$ protective film 4 satisfies the relation: t/(2×p)≦30%, SAW device 10 having the excellent temperature characteristics and the excellent characteristics can be obtained.

Fourth Exemplary Embodiment

A SAW device as an electronic component in accordance with a fourth exemplary embodiment of the present invention is described with reference to drawings.

SAW device 10 in accordance with the fourth exemplary embodiment uses SAW device 10 having the same configuration as SAW device 10 used in the first or second exemplary embodiment. Therefore, since the structure and the manufacturing method of SAW device 10 are the same as those of SAW device 10 shown in FIGS. 1, 2 and 3, the detail description is omitted.

In the fourth exemplary embodiment, SAW device 10 satisfies the relations: L1≦p1 and L2≧p2. Furthermore, in the fourth exemplary embodiment, the electrode normalized film thickness: h/(2×p) of IDT 22 used in all examples and comparative examples is 4.5%.

Figure 22:
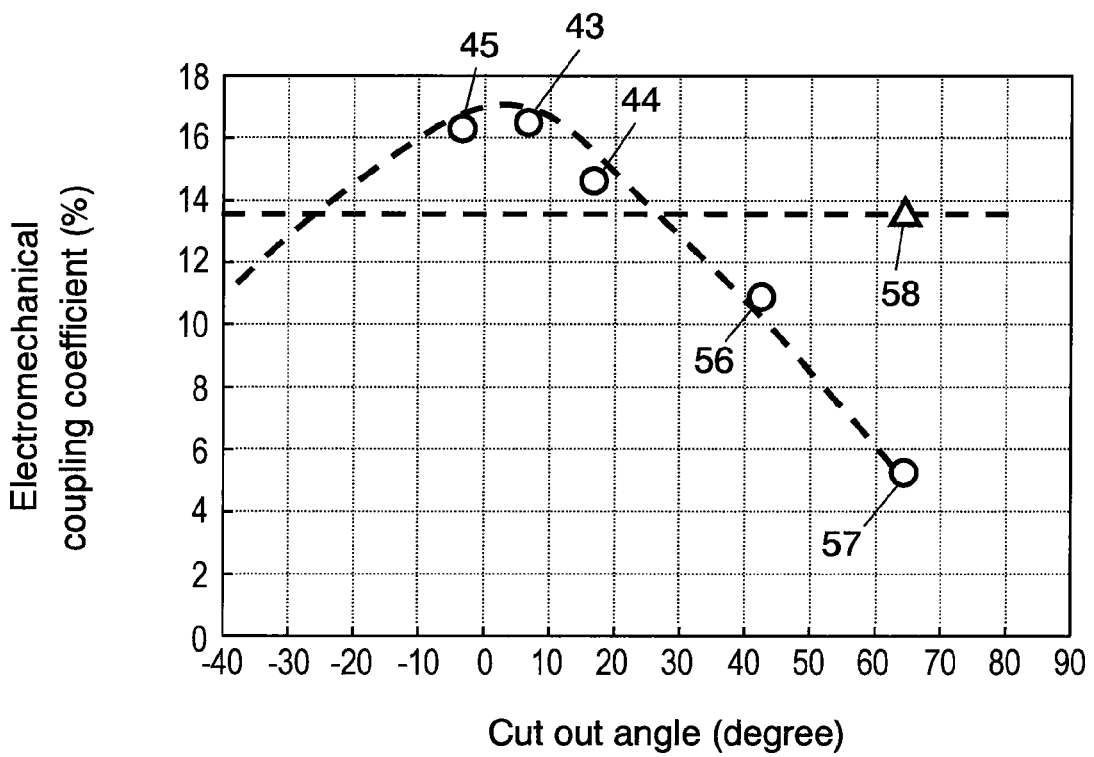
FIG. 22 is a graph showing an electrical characteristic of an electronic component in accordance with a fourth exemplary embodiment of the present invention.

In the fourth exemplary embodiment, in order to show the relation between a cut-out angle D degree of substrate 1 and the electromechanical coupling coefficient of SAW device 10 in which protective film 4 having the shape shown in the first exemplary embodiment is formed, SAW devices using six kinds substrates having different cut-out angles are produced. FIG. 22 shows the relation between the cut-out angle and the electromechanical coupling coefficient. In FIG. 22, values 43, 44, and 45 show the electromechanical coupling coefficients of examples 3, 4, 5, respectively. Furthermore, values 56, 57, and 58 show the electromechanical coupling coefficients of the comparative examples 6, 7, and 8, respectively. The examples 3, 4, and 5 show the electromechanical coupling coefficients when D is 5 degree, 15 degree, and −5 degree, respectively. Furthermore, the comparative examples 6 and 7 show the electromechanical coupling coefficients when D is 41 degree and 64 degree, respectively. Furthermore, the comparative example 8 shows the electromechanical coupling coefficient when the $SiO_2$ protective film is not provided and D is 64 degree. As shown in FIG. 22, the coupling coefficient when the cut-out angle D is 41 degree is about 11% and the coupling coefficient when the cut-out angle D is 64 degree is about 5.5%. On the contrary, in the examples 3, 4 and 5, extremely large electromechanical coupling coefficients are obtained. Furthermore, as the comparative example 8, the electromechanical coupling coefficient when the $SiO_2$ protective film is not provided and D is 64 degree is shown in the drawing. Therefore, in order to obtain an electromechanical coupling coefficient that is not smaller than the electromechanical coupling coefficient when the $SiO_2$ protective film is not provided, D satisfies at least the relation: −25 degree≦D≦25 degree.

Therefore, when SAW device 10 is produced so that it satisfies the relations: L1≦p1 and L2≧p2 and the cut-out angle D of the LN substrate satisfies the relation: −25 degree≦D≦25 degree, SAW device 10 having the excellent temperature characteristics and the large electromechanical coupling coefficient can be obtained. As to the cut-out angle D of the LN substrate, a rotation angle around the X-axis in the Z-axis direction is defined as D degree.

Fifth Exemplary Embodiment

A SAW device as an electronic component in accordance with a fifth exemplary embodiment of the present invention is described with reference to drawings.

SAW device 10 in accordance with the fifth exemplary embodiment is different from SAW device 10 used in the first or second exemplary embodiment in substrate 1 used for SAW device 10. That is to say, in SAW device 10 in accordance with the fifth exemplary embodiment, a bonded substrate of a 5° Y-LN substrate cut out from a Y-plate rotated by D=5 degree around the X-axis in the Z-axis direction and a silicon substrate is used as substrate 1. The configuration of other than substrate 1 is the same as in SAW device 10 used in the first or second exemplary embodiment. As a method of bonding the LN substrate and the silicon substrate to each other, a method such as a direct bonding technology or a bonding method using an adhesive agent can be used.

Similar to the first to fourth exemplary embodiments, SAW device 10 in accordance with the fifth exemplary embodiment satisfies the relations: L1≦p1 and L2≧p2. In order to show the relation of the temperature characteristics depending upon the presence of lamination of the silicon substrate, two kinds of SAW devices 10 are produced.

Figure 23:
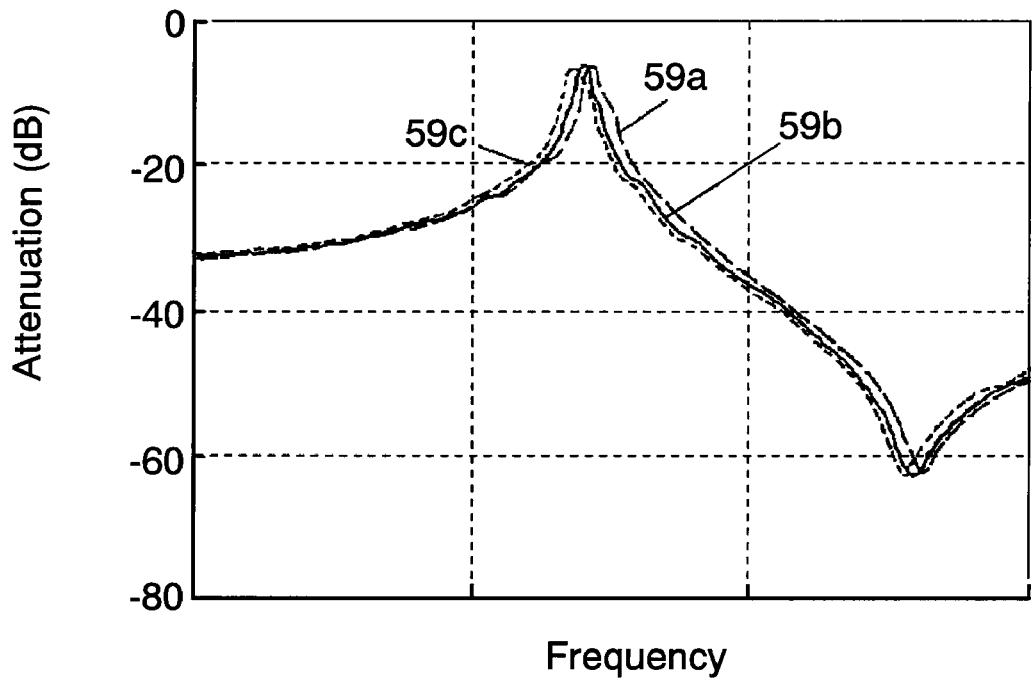
FIG. 23 is a graph showing an electrical characteristic of an electronic component in accordance with a fifth exemplary embodiment of the present invention.
Figure 24:
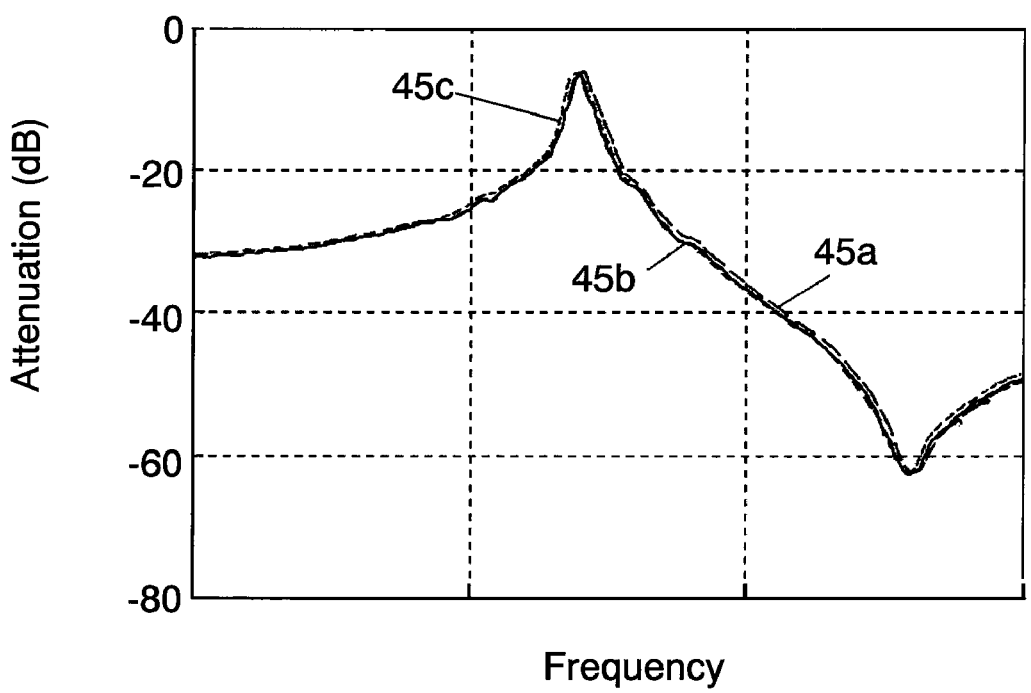
FIG. 24 is a graph showing an electrical characteristic of an electronic component in accordance with a fifth exemplary embodiment of the present invention.

FIGS. 23 and 24 show the electrical characteristics of SAW device 10 measured in the temperature environment of −35 degree Celsius, 25 degree Celsius, and +85 degree Celsius, respectively.

FIG. 23 shows the characteristic as a comparative example 9, when the 5° Y-LN substrate is used as substrate 1. Line segments 59a, 59b and 59c show the electrical characteristics of the SAW device as the comparative example 9 measured in the temperature environment of −35 degree Celsius, 25 degree Celsius, and +85 degree Celsius, respectively. Furthermore, FIG. 24 shows the characteristic as an example 6 when the bonded substrate of the 5° Y-LN substrate and the silicon substrate is used as substrate 1. Similarly, line segments 45a, 45b and 45c show the electrical characteristics of SAW device 10 of the example 6 measured in the temperature environment of −35 degree Celsius, 25 degree Celsius, and +85 degree Celsius, respectively. As shown in FIGS. 23 and 24, the frequency variation with respect to temperatures when the bonded substrate of the 5° Y-LN substrate and the silicon substrate is used as substrate 1 is smaller as compared with the frequency variation with respect to temperatures when the 5° Y-LN substrate is used as substrate 1. The temperature coefficient of frequency calculated from the anti-resonant frequency in the respective characteristics is about −33 ppm/K when the 5° Y-LN substrate is used as substrate 1. On the contrary, the temperature coefficient of frequency is about −10 ppm/K when the bonded substrate of the 5° Y-LN substrate and the silicon substrate is used as substrate 1, showing a significant improvement. Therefore, when the bonded substrate of the LN substrate and the silicon substrate is used as substrate 1, it is possible to obtain SAW device 10 having further excellent temperature characteristics and electrical characteristic.

Although the fifth exemplary embodiment does not refer to a thickness of the LN substrate, when the LN substrate is polished so as to be thin and then laminated with a silicon substrate, an effect of further improvement of the temperature characteristics can be obtained.

Furthermore, in the fifth exemplary embodiment, the silicon substrate is used. However, when glass, sapphire, or the like, having smaller coefficient of thermal expansion than the silicon substrate is used, the equal or higher effect can be obtained.

Sixth Exemplary Embodiment

In a sixth exemplary embodiment, a mobile phone is described as an example of electronic equipment.

Figure 25:
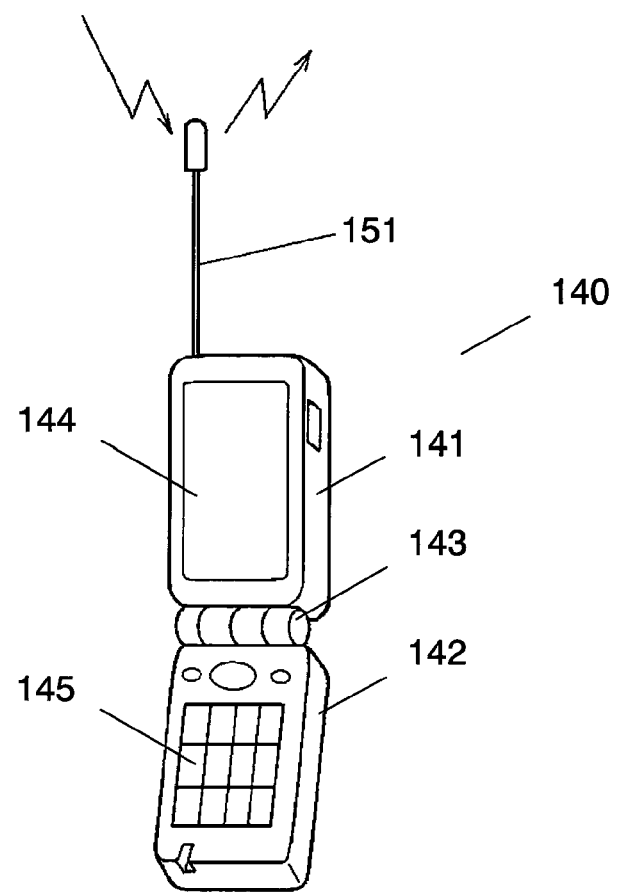
FIG. 25 is an overview diagram showing electronic equipment in accordance with a sixth exemplary embodiment of the present invention.
Figure 26:
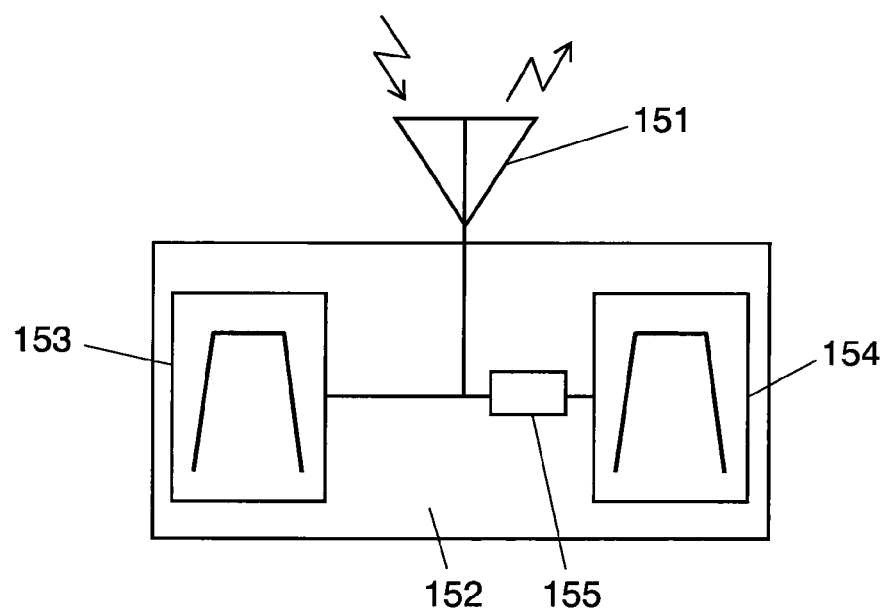
FIG. 26 is an electric circuit diagram showing an inside of the electronic equipment in accordance with the sixth exemplary embodiment of the present invention.

FIG. 25 is an overview diagram showing a mobile phone in accordance with the sixth exemplary embodiment of the present invention. FIG. 26 is an electric-circuit diagram showing a main part stored inside the mobile phone shown in FIG. 25. As shown in FIG. 25, mobile phone 140 includes first case 141 and second case 142, which are held around hinge part 143 in a way capable of opening and closing. Furthermore, mobile phone 140 has display part 144 and antenna 151 provided on first case 141, and input part 145 provided on second case 142. Furthermore, a circuit such as radio circuit (not shown) is stored inside first case 141 and second case 142, respectively. As shown in FIG. 26, mobile phone 140 includes antenna 151 and antenna duplexer 152 connected to antenna 151. Antenna duplexer 152 includes transmitting SAW filter 153, receiving SAW filter 154 and phase circuit 155. Transmitting SAW filter 153 and receiving SAW filter 154 are configured by connecting plural stages of SAW devices 10 described in the first to fifth exemplary embodiments in serial-parallel arrangement. Antenna duplexer 152 is an electric circuit that is electrically connected to antenna 151, for example, an antenna duplexer for WCDMA.

Furthermore, transmitting SAW filter 153 and receiving SAW filter 154 constituting antenna duplexer 152 may have different pitches of electrode finger 22a. However, by allowing transmitting SAW filter 153 and receiving SAW filter 154 to have different electrode normalized film thicknesses respectively, the frequency characteristics can be adjusted. When transmitting SAW filter 153 and receiving SAW filter 154 have different pitches of electrode finger 22a, since electrode film thickness h can be changed between a filter at the transmitting side and a filter at the receiving side, an optimum configuration of antenna duplexer 152 can be obtained.

FIG. 27 shows the electrical characteristics of antenna duplexer 152 using transmitting SAW filter 153 and receiving SAW filter 154. Line segment 47 shows the electrical characteristic of transmitting SAW filter 153 and line segment 48 shows the electrical characteristic of receiving SAW filter 154. In the passband, an excellent insertion loss of about −1.5 dB is realized. Furthermore, also in the stopband, an excellent attenuation of about −60 dB is realized. Note here that the passband means the range from 1920 MHz to 1980 MHz at the transmitting side and the range from 2110 MHz to 2170

MHz at the receiving side. Furthermore, the stopband means the range from 2110 MHz to 2170 MHz at the transmitting side and the range from 1920 MHz to 1980 MHz at the receiving side. In this way, when SAW devices 10 described in the first to fifth exemplary embodiments are used in the electronic equipment, it is possible to easily obtain an antenna duplexer that is excellent in the temperature characteristics and the electrical characteristics.

INDUSTRIAL APPLICABILITY

As mentioned above, according to the present invention, a protective film is formed so as to cover an electrode formed on a substrate. By setting the shape or the thickness of the protective film to a specific range, it is possible to obtain a surface acoustic wave device that is excellent in the temperature characteristics and the electrical characteristic.

The invention claimed is:

1. A surface acoustic wave device, comprising:
a substrate including lithium niobate;
an IDT being provided on an upper surface of the substrate and including a plurality of electrode fingers; and
a protective film covering the IDT and having an uneven shape on an upper surface thereof,
wherein following relations are satisfied, $$p1+p2=p, \text{ and } 7.8\% \leq h/(2 \times p) \leq 9.8\%,$$

when a pitch width of one pitch of the IDT is p,
a width of one of the electrode fingers is p1,
a width between the electrode fingers is p2, and
a thickness from the surface of the substrate to an upper part of the IDT in an equivalent thickness of aluminum is h,
wherein following relations are satisfied, $$L1+L2=L, L1 \leq p1, \text{ and } L2 \geq p2$$

wherein when a pitch width of one pitch in the uneven shape is L,
a width of one pitch of a convex portion in the uneven shape is L1, and
a width of one pitch of a concave portion in the uneven shape is L2, and
wherein the electrode finger is made of any one of aluminum and an alloy including aluminum as a main component.

2. The surface acoustic wave device of claim 1,
wherein a following relation is further satisfied, $$8.5\% \leq h/(2 \times p) \leq 9.0\%.$$

3. The surface acoustic wave device of claim 1,
wherein the electrode finger further comprises any one of a metal having a higher density than aluminum and an alloy including a metal having a higher density than aluminum.

4. The surface acoustic wave device of claim 1,
wherein the electrode finger includes a laminated film having a first electrode film and a second electrode film;
the first electrode film is made of any one of aluminum and an alloy including aluminum as a main component;
the second electrode film is made of any one of a metal having a higher density than aluminum and an alloy including a metal having a higher density than aluminum as a main component.

5. The surface acoustic wave device of claim 4,
wherein the first electrode film is provided on the substrate
the second electrode film is provided on the first electrode film, and
the first electrode film is made of aluminum.

6. The surface acoustic wave device of claim 1,
wherein when the lithium niobate material forming the substrate has a cut-out angle of D degree as a rotational angle around an X-axis in a Z-axis direction, the lithium niobate material is cut out of a Y-plate at an angle that satisfies a following relation, $-25 \text{ degree} \leq D \leq +25$ degree.

7. The surface acoustic wave device of claim 1,
wherein the substrate is a bonded substrate of a lithium niobate substrate and a silicon substrate.

8. The surface acoustic wave device of claim 1,
wherein thickness t of the protective film is defined by a height from the surface of the substrate to the concave portion, and satisfies a following relation, $t/(2 \times p) \leq 30\%$.

9. The surface acoustic wave device of claim 1,
wherein the protective film is made of silicon dioxide.

10. The surface acoustic wave device of claim 1,
wherein a shape of the uneven shape of the protective film is controlled so as to suppress spurious responses.

11. A surface acoustic wave filter, comprising:
a plurality of surface acoustic wave devices connected like a ladder,
wherein at least one of the plurality of surface acoustic wave devices is the surface acoustic wave device of claim 1.

12. An antenna duplexer, comprising:
the surface acoustic wave filter of claim 11 disposed at one of an input side and an output side of a signal.

13. An electronic equipment, comprising:
an antenna element; and
an electric circuit electrically connected to the antenna element,
wherein the electric circuit is the antenna duplexer of claim 12.

14. A surface acoustic wave filter,
wherein a plurality of surface acoustic wave devices having an IDT are disposed along a direction in which a surface acoustic wave propagates, and the IDTs are adjacent to each other; and
at least one of the plurality of the surface acoustic wave devices is the surface acoustic wave device of claim 1.

15. An antenna duplexer, comprising:
the surface acoustic wave filter of claim 14 disposed at one of an input side and an output side of a signal.

16. An electronic equipment, comprising:
an antenna element; and
an electric circuit electrically connected to the antenna element,
wherein the electric circuit is the antenna duplexer of claim 15.

17. A method of manufacturing a surface acoustic wave device, the surface acoustic wave device comprising:
a substrate including lithium niobate;
an IDT being provided on an upper surface of the substrate and including a plurality of electrode fingers; and
a protective film covering the IDT and having an uneven shape on an upper surface thereof,
wherein the method satisfies a following first relations, $$p1+p2=p, \text{ and } 7.8\% \leq h/(2 \times p) \leq 9.8\%$$

when a pitch width of one pitch of the IDT is p,
a width of one of the electrode fingers is p1,
a width between the electrode fingers is p2, and
a thickness from the surface of the substrate to an upper part of the IDT in an equivalent thickness of aluminum is h;
a shape of the uneven shape is controlled in accordance with an electrode film thickness; and
the method satisfies a following second relations, $$L1+L2=L, L1 \leq p1, \text{ and } L2 \geq p2$$

when a pitch width of one pitch in the uneven shape is L;
a width of one pitch of a convex portion in the uneven shape is L1, and
a width of one pitch of a concave portion in the uneven shape is L2, and
wherein the surface acoustic wave device satisfying the first relations and the second relations is produced by using a bias sputtering method.

18. The method of claim 17,
wherein the electrode finger includes
a first electrode film made of aluminum provided on the substrate, and
a second electrode film provided on the first electrode film,
the second electrode film is made of any one of a metal having a higher density than aluminum and an alloy including a metal having a higher density than aluminum as a main component.

19. A surface acoustic wave device, comprising:
a substrate including lithium niobate;
an IDT being provided on an upper surface of the substrate and including a plurality of electrode fingers; and
a protective film covering the IDT and having an uneven shape on an upper surface thereof,
wherein following relations are satisfied, $$p1+p2=p, \text{ and } h/(2 \times p) \geq 4.5\%,$$

when a pitch width of one pitch of the IDT is p,
a width of one of the electrode fingers is p1,
a width between the electrode fingers is p2, and
a thickness from the surface of the substrate to an upper part of the IDT in an equivalent thickness of aluminum is h,
the electrode finger includes
a first electrode film made of aluminum provided on the substrate, and
a second electrode film provided on the first electrode film,
the first electrode film is made of aluminum,
the second electrode film is made of any one of a metal having a higher density than aluminum and an alloy including a metal having a higher density than aluminum as a main component.

20. The surface acoustic wave device of claim 19,
wherein following relations are satisfied, $$L1+L2=L, L1 \leq p1, \text{ and } L2 \geq p2$$

when a pitch width of one pitch in the uneven shape is L,
a width of one pitch of a convex portion in the uneven shape is L1, and
a width of one pitch of a concave portion in the uneven shape is L2.

21. The surface acoustic wave device of claim 20,
wherein a following relation is further satisfied, $$8.5\% \leq h/(2 \times p) \leq 9.0\%.$$

* * * * *

UNITED STATES PATENT AND TRADEMARK OFFICE
CERTIFICATE OF CORRECTION

| | | |
|---|---|---|
| PATENT NO. | : 8,035,460 B2 | Page 1 of 1 |
| APPLICATION NO. | : 12/279631 | |
| DATED | : October 11, 2011 | |
| INVENTOR(S) | : Hidekazu Nakanishi et al. | |

It is certified that error appears in the above-identified patent and that said Letters Patent is hereby corrected as shown below:

In column 7, line 12, insert -- $\leq$ -- in the formula between 4.5% and h

In column 7, line 13, insert -- $\leq$ -- in the formula between (2xp) and 0.09

Signed and Sealed this
Twentieth Day of March, 2012

David J. Kappos
*Director of the United States Patent and Trademark Office*